US009580649B2

(12) United States Patent
Vosgroene et al.

(10) Patent No.: US 9,580,649 B2
(45) Date of Patent: Feb. 28, 2017

(54) PROCESS FOR PRODUCTION OF PHOSPHORS

(71) Applicant: Merck Patent GmbH, Darmstadt (DE)

(72) Inventors: Tim Vosgroene, Ober-Ramstadt (DE); Holger Winkler, Darmstadt (DE); Ralf Petry, Griesheim (DE); Andreas Benker, Lautertal (DE); Christof Hampel, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 25 days.

(21) Appl. No.: 14/414,233

(22) PCT Filed: Jun. 14, 2013

(86) PCT No.: PCT/EP2013/001768
§ 371 (c)(1),
(2) Date: Jan. 12, 2015

(87) PCT Pub. No.: WO2014/008970
PCT Pub. Date: Jan. 16, 2014

(65) Prior Publication Data
US 2015/0203748 A1    Jul. 23, 2015

(30) Foreign Application Priority Data
Jul. 13, 2012  (EP) .................................... 12005188

(51) Int. Cl.
| C09K 11/59 | (2006.01) |
| C09K 11/77 | (2006.01) |
| C09K 11/08 | (2006.01) |
| H01L 33/50 | (2010.01) |

(52) U.S. Cl.
CPC ...... *C09K 11/7734* (2013.01); *C09K 11/0883* (2013.01); *C09K 11/59* (2013.01); *H01L 33/502* (2013.01)

(58) Field of Classification Search
CPC ................................................ C09K 11/7734
See application file for complete search history.

(56) References Cited

U.S. PATENT DOCUMENTS

| 6,649,946 | B2 | 11/2003 | Bogner et al. |
| 6,682,663 | B2 | 1/2004 | Botty et al. |
| 7,671,529 | B2 * | 3/2010 | Mueller ............. C09K 11/7734 |
| | | | 252/301.4 F |
| 8,896,006 | B2 | 11/2014 | Becker et al. |
| 2003/0020101 | A1 | 1/2003 | Bogner et al. |
| 2003/0024438 | A1 | 2/2003 | Botty et al. |
| 2011/0135928 | A1 | 6/2011 | Ravilisetty et al. |
| 2011/0163344 | A1 | 7/2011 | Cakmak et al. |
| 2012/0037938 | A1 | 2/2012 | Becker et al. |
| 2012/0300155 | A1 | 11/2012 | Winkler et al. |
| 2013/0063926 | A1 | 3/2013 | Winkler et al. |
| 2013/0120964 | A1 | 5/2013 | Vosgroene et al. |
| 2013/0168574 | A1 | 7/2013 | Winkler et al. |

FOREIGN PATENT DOCUMENTS

| DE | 102008058295 A1 | 5/2010 |
| EP | 1104799 A1 | 6/2001 |
| JP | 2012509373 A | 4/2012 |
| WO | 2009/117148 A2 | 9/2009 |
| WO | 2010/029184 A1 | 3/2010 |
| WO | 2011/091839 A1 | 8/2011 |
| WO | 2011/147517 A1 | 12/2011 |
| WO | 2012/010244 A1 | 1/2012 |
| WO | 2012/034625 A1 | 3/2012 |

OTHER PUBLICATIONS

International Search Report dated Oct. 22, 2013 issued in corresponding PCT/EP2013/001768 application (pp. 1-3).
R.J. Xie et al., "A Simple, Efficient Synthetic Route to Sr2Si5N8:Eu2+-BasedRed Phosphors for White Light-Emitting Diodes", Chemical Materials, vol. 18, No. 23 (Jan. 1, 2006) pp. 5578-5583.
H.A. Hoppe et al., "Luminescence in Eu2+-Doped Ba2Si5N8: Fluorescence, Thermoluminescence, and Upconversion", Journal of Physics and Chemistry of Solids, vol. 61 (Jan. 1, 2000) pp. 2001-2006.
T. Xiaoming et al., "Effect of Strontium Nitride on the Properties of Sr2Si5N8:Eu2+ Red Phosphor", Journal of Semiconductors, vol. 32, No. 1 (Jan. 2011) pp. 012003-1-012003-3.
English Translation of CN 201380037385.2 Office Action (3 pages).
R.J. Xie et al., "A Simple, Efficient Synthetic Route to Sr2Si5N8:Eu2+-Based Red Phosphors for White Light-Emitting Diodes", Chemical Materials, vol. 18, No. 23 (2006) pp. 5578-5583.
X. Piao et al., "Characterization and Luminescence Properties of Sr2Si5N8:Eu2+ Phosphor for White Light-Emitting-Diode Illumination", Applied Physics Letters, vol. 88 (2006) pp. 161908.
Y.Q. Li et al., "Luminescence Properties of Red-Emitting M2Si5N8:Eu2+ (M=Ca, Sr, Ba) LED Conversion Phosphors", Journal of Alloys and Compounds, vol. 417 (2006) pp. 273-279.
H.A. Hoppe et al., "Luminescence in Eu2+-Doped Ba2Si5N8: Fluorescence, Thermoluminescence, and Upconversion", Journal of Physics and Chemistry of Solids, vol. 61 (2000) pp. 2001-2006.
Japanese Office Action dated Nov. 7, 2016 issued in corresponding JP application 2015-520833 and english translation(8pages).

\* cited by examiner

*Primary Examiner* — Carol M Koslow
(74) *Attorney, Agent, or Firm* — Millen White Zelano & Branigan, P.C.

(57) ABSTRACT

The present invention relates to a process for the preparation of a europium-doped alkaline-earth metal siliconitride or silicooxynitride having increased emission efficiency. The present invention furthermore relates to europium-doped alkaline-earth metal siliconitrides or silicooxynitrides which are obtainable by the preparation process according to the invention, and to the use of the europium-doped alkaline-earth metal siliconitrides or silicooxynitrides according to the invention as conversion phosphors. The present invention furthermore also relates to a light-emitting device which comprises a europium-doped alkaline-earth metal siliconitride or silicooxynitride according to the invention.

24 Claims, 8 Drawing Sheets

PROCESS FOR PRODUCTION OF PHOSPHORS

The present invention relates to a process for the preparation of a europium-doped alkaline-earth metal siliconitride or silicooxynitride having increased emission efficiency. The present invention furthermore relates to europium-doped alkaline-earth metal siliconitrides or silicooxynitrides which are obtainable by the preparation process according to the invention, and to the use of the europium-doped alkaline-earth metal siliconitrides or silicooxynitrides according to the invention as conversion phosphors. The present invention furthermore relates to a light-emitting device which comprises a europium-doped alkaline-earth metal siliconitride or silicooxynitride according to the invention.

Inorganic fluorescent powders which can be excited in the blue and/or UV spectral region are gaining ever greater importance as conversion phosphors for phosphor-converted LEDs, pc-LEDs for short. In the mean time, many conversion phosphor systems are known, such as, for example, alkaline-earth metal orthosilicates, thiogallates, garnets and nitrides, each of which are doped with $Ce^{3+}$ or $Eu^{2+}$. In particular, the last-mentioned nitride phosphors, for example $M_2Si_5N_8$:Eu (M=Ca, Sr and/or Ba) or MAlSiN$_3$:Eu (M=Ca and/or Sr) are currently the subject of intensive research, since these materials have emission wavelengths above 600 nm and are therefore of importance for the production of warm-white pc-LEDs having colour temperatures<4000 K.

The currently known processes for the preparation of $M_2Si_5N_8$:Eu are summarised briefly below, where M stands for an alkaline-earth metal:
(1) $(2-x)$ M+x Eu+5 Si(NH$_2$)→$M_{2-x}Eu_xSi_5N_8$+5 H$_2$ (Schnick et al., Journal of Physics and Chemistry of Solids (2000), 61(12), 2001-2006)
(2) $(2-x)$ M$_3$N$_2$+3x EuN+5 Si$_3$N$_4$→3$M_{2-x}Eu_xSi_5N_8$+0.5x N$_2$ (Hintzen et al., Journal of Alloys and Compounds (2006), 417(1-2), 273-279)
(3) $(2-x)$ MO+1.666 Si$_3$N$_4$+0.5x Eu$_2$O$_3$+(2+0.5x) C+1.5N$_2M_{2-x}EU_xSi_5N_8$+(2+0.5x) CO (Piao et al., Applied Physics Letters 2006, 88, 161908)
(4) 2 Si$_3$N$_4$+2(2-x) MCO$_3$+x/2 Eu$_2$O$_3$→$M_{2-x}Eu_xSi_5N_8$+M$_2$SiO$_4$+CO$_2$ (Xie et al., Chemistry of Materials, 2006, 18, 5578)
(5) $(2-x)$ M+x Eu+5 SiCl$_4$+28 NH$_3$→$M_{2-x}Eu_xSi_5N_8$+20 NH$_4$Cl+2H$_2$ (Jansen et al., WO 2010/029184 A1).

Silicooxynitrides are accessible, for example, by stoichiometric mixing of SiO$_2$, M$_3$N$_2$, Si$_3$N$_4$ and EuN and subsequent calcination at temperatures of about 1600° C. (for example in accordance with WO 2011/091839).

Of the above processes for the preparation of siliconitrides, process (2) is particularly suitable since the corresponding starting materials are commercially available, no secondary phases are formed in the synthesis, and the efficiency of the materials obtained is the highest. This process is frequently followed by a second calcination step which further increases the efficiency of the material a little.

In a modification of the above process (2), the basic alkaline-earth metal nitride can be employed in an excess of up to 30 mol % relative to the stoichiometric amount indicated in equation (2). The use of a superstoichiometric amount of the alkaline-earth metal nitride results in increased radiation-induced emission efficiency of the conversion phosphor obtained.

In addition, it has also been found that the excess of alkaline-earth metal nitride employed can be selected to be so high that another nitride phase is theoretically formed. If the respective starting materials are employed in accordance with the following reaction equation (ii), it is not the likewise known material SrSiN$_2$ that is formed, but instead Sr$_2$Si$_5$N$_8$, which is formed as standard in accordance with reaction equation (i) (the europium compound necessary for the doping with europium has been omitted for simplification):

(i)

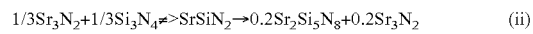

(ii)

According to equation (ii), however, only the strontium compound can be prepared. However, the corresponding Ba$_2$Si$_5$N$_8$ cannot be prepared in phase-pure form analogously to reaction equation (ii), but instead only in accordance with reaction equation (i).

It has furthermore been observed that, in the case of the use of a superstoichiometric amount of the alkaline-earth metal nitride in a reaction modified from process (2), even a second calcination step has no effect on the efficiency of the material prepared in this way.

Since alkaline-earth metal nitrides are very expensive, the disadvantage of a process in which they are employed in superstoichiometric amounts is obvious. In order to conserve resources, it would therefore be desirable to have available a process in which a smaller amount of the alkaline-earth metal nitride is required. The disadvantage of a process in which the alkaline-earth metal nitride is employed in a stoichiometric amount or only in slight excess is, however, as described above, the lower radiation-induced emission efficiency of the material obtained.

The object of the present invention was thus to provide a process by means of which the radiation-induced emission efficiency of europium-doped alkaline-earth metal siliconitrides or silicooxynitrides can be increased without an extreme excess of alkaline-earth metal nitride having to be used for the synthesis. A further object of the present invention is in addition to provide a process for the preparation of europium-doped alkaline-earth metal siliconitrides or silicooxynitrides having increased radiation-induced emission efficiency by means of which the barium compounds and not only the strontium compounds are also obtainable. A further object of the present invention is to provide a process by means of which the emission wavelength of a europium-doped alkaline-earth metal siliconitride or silicooxynitride can be shifted to greater or smaller wavelengths.

In a first embodiment of the present invention, a process for increasing the radiation-induced emission efficiency and/or a process for shifting the emission wavelength of a europium-doped alkaline-earth metal siliconitride or of a europium-doped alkaline-earth metal silicooxynitride is provided which comprises the following steps:
(a) preparation of a mixture of a europium-doped alkaline-earth metal siliconitride or europium-doped alkaline-earth metal silicooxynitride and an alkaline-earth metal nitride, where the alkaline-earth metal of the europium-doped alkaline-earth metal siliconitride or silicooxynitride and of the alkaline-earth metal nitride may be identical or different; and
(b) calcination of the mixture under non-oxidising conditions.

Europium-doped alkaline-earth metal siliconitrides or europium-doped alkaline-earth metal silicooxynitrides are known to the person skilled in the art as conversion phosphors, and the person skilled in the art knows which compounds fall within these classes of material. In particular, these are compounds which, apart from the dopant, essentially consist of the elements alkaline-earth metal, in particular Ca, Sr and/or Ba, silicon, nitrogen and, in the case of the oxynitrides, oxygen. They may also contain $SiO_2$ and/or $Si_3N_4$, which may in each case be in amorphous and/or crystalline form. It should be pointed out that alumosiliconitrides, which additionally also contain aluminium, are not taken to be siliconitrides or silicooxynitrides in the sense of the present application. The term "conversion phosphor" in the present application is taken to mean a material which absorbs radiation in a certain wavelength region of the electromagnetic spectrum, preferably in the blue or UV spectral region, and emits visible light in another wavelength region of the electromagnetic spectrum, preferably in the red, orange, yellow or green spectral region, in particular in the red spectral region.

The term "radiation-induced emission efficiency" should also be understood in this connection, i.e. the conversion phosphor absorbs radiation in a certain wavelength region and emits radiation in another wavelength region with a certain efficiency. The increase in the emission efficiency is measured in the increase in the emitted light intensity. The term "shift of the emission wavelength" is taken to mean that a conversion phosphor emits light at a different wavelength compared with another or similar conversion phosphor, i.e. shifted to a smaller or greater wavelength. The emission maximum is thus shifted.

The europium-doped alkaline-earth metal siliconitride or silicooxynitride employed in the above-mentioned process is preferably a compound of the following general formula (I):

$$EA_d Eu_e E_f N_f O_x \cdot mSiO_2 \cdot nSi_3N_4 \qquad \text{formula (I)}$$

in which the following applies to the symbols and indices used:

EA is at least one alkaline-earth metal, in particular selected from the group consisting of Ca, Sr and Ba;
E is Si;
$0.80 \leq d \leq 1.995$;
$0.005 \leq c \leq 0.2$;
$4.0 \leq e \leq 6.00$;
$5.00 \leq f \leq 8.70$;
$0 \leq x \leq 3.00$;
$0 \leq m \leq 2.50$;
$0 \leq n \leq 0.50$;
where the following relationship furthermore applies to the indices:

$$2d+2c+4e=3f+2x.$$

In the compounds of the formula (I), preferably m=0 and n=0.

Preferred europium-doped alkaline-earth metal siliconitrides or silicooxynitrides are furthermore the compounds of the following formulae (Ia) and (Ib),

$$Ba_{2-a-b-c+1.5z}Sr_aCa_bEu_cSi_5N_{8-2/3x+z}O_x \cdot mSiO_2 \cdot nSi_3N_4 \qquad \text{formula (Ia)}$$

where the indices used have the following meanings:
$0 \leq a \leq 2$;
$0 \leq b \leq 2$;
$0.01 \leq c \leq 0.2$, preferably $0.02 \leq c \leq 0.1$;
$0 \leq x \leq 1$, preferably $0 \leq x \leq 0.6$;
$0 \leq z \leq 3.0$, preferably $0 \leq z \leq 1.0$, particularly preferably $z=0$; and $a+b+c \leq 2+1.5z$;
$0 \leq m \leq 2.50$, preferably $0 \leq m \leq 1.00$, particularly preferably m=0;
$0 \leq n \leq 0.50$, preferably n=0;

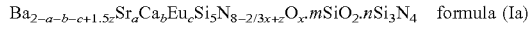

$$Ba_{2-a-b-c-0.5x+1.5z}Sr_aCa_bEu_c Si_5N_{8-x+z}O_x \cdot mSiO_2 \cdot nSi_3N_4 \qquad \text{formula (Ib)}$$

where the indices used have the following meanings:
$0 \leq a \leq 2$;
$0 \leq b \leq 2$;
$0.01 \leq c \leq 0.2$, preferably $0.02 \leq c \leq 0.1$;
$0 \leq x \leq 1$, preferably $0 \leq x \leq 0.6$;
$0 \leq z \leq 3.0$, preferably $0 \leq z \leq 1.0$, particularly preferably z=0;
$0 \leq m \leq 2.50$, preferably $0 \leq m \leq 1.00$, particularly preferably m=0;
$0 \leq n \leq 0.50$, preferably n=0.

A further suitable alkaline-earth metal siliconitride which can be employed in the above-mentioned process is a compound of the following general formula (II),

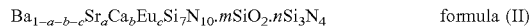

$$Ba_{1-a-b-c}Sr_aCa_bEu_cSi_7N_{10} \cdot mSiO_2 \cdot nSi_3N_4 \qquad \text{formula (II)}$$

where the indices used have the following meanings:
$0 \leq a \leq 1$;
$0 \leq b \leq 1$;
$0.01 \leq c \leq 0.2$, preferably $0.02 \leq c \leq 0.1$; and
$a+b+c \leq 1$;
$0 \leq m \leq 2.50$, preferably $0 \leq m \leq 1.00$, particularly preferably m=0;
$0 \leq n \leq 0.50$, preferably n=0.

In the compounds of the formulae (I), (Ia), (Ib) and (II), preferably m=0 or n=0, particularly preferably m=0 and n=0.

In the compounds of the formulae (Ia), (Ib) and (II), the above-mentioned preferences particularly preferably occur simultaneously.

The europium-doped alkaline-earth metal siliconitride or silicooxynitride used in step (a) can be prepared by any process known from the prior art, as described, for example, above under processes (1) to (5) or in WO 2011/091839. However, it is particularly preferred for the europium-doped alkaline-earth metal siliconitride or silicooxynitride to be prepared by a step (a') comprising the calcination of a mixture comprising a europium source, a silicon source and an alkaline-earth metal nitride under non-oxidising conditions. This step (a') precedes step (a) of the above-mentioned process.

The europium source employed in step (a') can be any conceivable europium compound by means of which a europium-doped alkaline-earth metal siliconitride or silicooxynitride can be prepared. The europium source employed in the process according to the invention is preferably europium oxide (especially $Eu_2O_3$) and/or europium nitride (EuN), in particular $Eu_2O_3$.

The silicon source employed in step (a') can be any conceivable silicon compound by means of which a europium-doped alkaline-earth metal siliconitride or silicooxynitride can be prepared. The silicon source employed in the process according to the invention is preferably silicon nitride and optionally silicon oxide. If a pure nitride is to be prepared, the silicon source is preferably silicon nitride. If the preparation of an oxynitride is desired, the silicon source employed is also silicon dioxide besides silicon nitride.

An alkaline-earth metal nitride is taken to mean a compound of the formula $M_3N_2$, in which M is on each occurrence, independently of one another, an alkaline-earth metal ion, in particular selected from the group consisting of calcium, strontium and barium. In other words, the alkaline-earth metal nitride is preferably selected from the group consisting of calcium nitride ($Ca_3N_2$), strontium nitride ($Sr_3N_2$), barium nitride ($Ba_3N_2$) and mixtures thereof.

The compounds employed in step (a') for the preparation of the europium-doped alkaline-earth metal siliconitride or silicooxynitride are preferably employed in a ratio to one another such that the number of atoms of the alkaline-earth

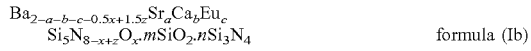

metal, silicon, europium, nitrogen and, if used, oxygen corresponds to the desired ratio in the alkaline-earth metal siliconitride or silicooxynitride of the above-mentioned formula (I), (Ia), (Ib) or (II). In particular, a stoichiometric ratio is used, but a slight excess of the alkaline-earth metal nitride is also possible.

The weight ratio of the europium-doped alkaline-earth metal siliconitride or silicooxynitride to the alkaline-earth metal nitride in step (a) of the process according to the invention is preferably in the range from 2:1 to 20:1 and more preferably in the range from 4:1 to 9:1.

The process here is carried out under non-oxidising conditions, i.e. under substantially or completely oxygen-free conditions, in particular under reducing conditions.

If the process according to the invention is to be employed for shifting the emission wavelength of the europium-doped alkaline-earth metal siliconitride or silicooxynitride, it is preferred for the alkaline-earth metal in the alkaline-earth metal nitride in step (a) to be different from the alkaline-earth metal in the europium-doped alkaline-earth metal siliconitride or silicooxynitride.

If, for example, barium is employed as alkaline-earth metal in the alkaline-earth metal siliconitride or silicooxynitride in step (a), it is preferred for strontium to be employed as alkaline-earth metal in the alkaline-earth metal nitride. In this way, the process according to the invention results in a europium-doped alkaline-earth metal siliconitride or silicooxynitride which exhibits a red-shifted emission compared with the europium-doped barium siliconitride or silicooxynitride employed as starting material. If, conversely, strontium is employed as alkaline-earth metal in the europium-doped alkaline-earth metal siliconitride or silicooxynitride of step (a) and barium as alkaline-earth metal in the alkaline-earth metal nitride, this results in a europium-doped alkaline-earth metal siliconitride or silicooxynitride which exhibits a blue-shifted emission compared with the strontium siliconitride or silicooxynitride employed as starting material.

A further embodiment of the present invention relates to a process for the preparation of a post-treated europium-doped alkaline-earth metal siliconitride or a post-treated europium-doped alkaline-earth metal silicooxynitride, comprising the following steps:
(i) synthesis of a europium-doped alkaline-earth metal siliconitride or silicooxynitride; and
(ii) calcination of a mixture comprising the europium-doped alkaline-earth metal siliconitride or silicooxynitride obtained in step (i) and an alkaline-earth metal nitride under non-oxidising conditions.

The synthesis in process step (i) is preferably carried out by calcination of a mixture comprising at least one europium source, at least one silicon source and at least one alkaline-earth metal nitride under non-oxidising conditions. The calcination of the mixture of this europium-doped alkaline-earth metal siliconitride or silicooxynitride with an alkaline-earth metal nitride in step (ii) gives the post-treated europium-doped alkaline-earth metal siliconitride or silicooxynitride. The term "post-treated" in the sense of the present invention therefore relates to a europium-doped alkaline-earth metal siliconitride or silicooxynitride which has been calcined with an alkaline-earth metal nitride under non-oxidising conditions.

The post-treated europium-doped alkaline-earth metal siliconitride or silicooxynitride prepared in the process according to the invention of this embodiment is likewise defined as described above. All preferred variants indicated above are also preferred here in accordance with the invention.

Step (i) is preferably carried out in an identical manner to step (a') described above. All definitions and preferred variants mentioned above for step (a') also apply in accordance with the invention to step (i).

The product obtained in step (i) is preferably a europium-doped alkaline-earth metal siliconitride or silicooxynitride, as defined above. Preference is thus given to compounds of the formulae (I), (Ia), (Ib) and (II). The difference of the europium-doped alkaline-earth metal siliconitride or silicooxynitride obtained in step (i) from the post-treated europium-doped alkaline-earth metal siliconitride or silicooxynitride prepared in the process according to the invention of the second embodiment cannot be observed with reference to the empirical formula if the alkaline-earth metal of the europium-doped alkaline-earth metal siliconitride or silicooxynitride and of the alkaline-earth metal nitride are the same, so that both compounds are preferably a compound of the general formula (I), (Ia), (Ib) or (II). If the alkaline-earth metal of the europium-doped alkaline-earth metal siliconitride or silicooxynitride is different from the alkaline-earth metal of the alkaline-earth metal nitride, the content of the alkaline-earth metals of the europium-doped alkaline-earth metal siliconitride or silicooxynitride also differs from that of the post-treated europium-doped alkaline-earth metal siliconitride or silicooxynitride. If, for example, a barium siliconitride or silicooxynitride is thus post-treated with strontium nitride, a barium strontium siliconitride or silicooxynitride is obtained after the post-treatment. The essential difference which can be observed is, however, not in the structural formula (I) or (II) indicated, but instead is observed in particular in the radiation-induced emission efficiency. If the alkaline-earth metal nitride employed in step (i) is a different alkaline-earth metal nitride than in step (ii), the difference of the europium-doped alkaline-earth metal siliconitride or silicooxynitride from step (i) from the post-treated europium-doped alkaline-earth metal siliconitride or silicooxynitride obtained by step (ii) is that the emission maximum of the radiation-induced emission is shifted.

The ratio, based on the weight, of europium-doped alkaline-earth metal siliconitride or silicooxynitride from step (i) to the alkaline-earth metal nitride in step (ii) is preferably in the range from 2:1 to 20:1 and more preferably in the range from 4:1 to 9:1.

All mixtures prepared in the processes according to the invention are preferably prepared by converting the starting compounds into a homogeneous mixture. In other words, the starting compounds are employed in powder form and converted into a homogeneous mixture with one another, for example by a mortar.

All calcination steps, such as steps (a'), (b), (i) and (ii), are preferably carried out under non-oxidising conditions. Non-oxidising conditions are taken to mean any conceivable non-oxidising atmospheres, in particular substantially oxygen-free atmospheres, i.e. an atmosphere whose maximum content of oxygen is <100 ppm, in particular <10 ppm, where in the present case vacuum is not suitable as non-oxidising atmosphere. A non-oxidising atmosphere can be produced, for example, through the use of protective gas, particularly nitrogen or argon. A preferred non-oxidising atmosphere is a reducing atmosphere. The reducing atmosphere is defined as comprising at least one gas having a reducing action. Which gases have a reducing action is known to the person skilled in the art. Examples of suitable reducing gases are hydrogen, carbon monoxide, ammonia or ethylene, more preferably hydrogen, where these gases may also be mixed with other non-oxidising gases. The reducing atmosphere is particularly preferably produced by a mixture of nitrogen and hydrogen, preferably in the ratio $H_2:N_2$ of 10:50 to 33:30, in each case based on the volume.

Calcination steps (a'), (b), (i) and (ii) are preferably each carried out, independently of one another, at a temperature in the range from 1200° C. to 2000° C., more preferably 1400° C. to 1800° C. and most preferably 1500° C. to 1700° C. The calcination duration here is preferably in each case, independently of one another, 2 to 14 h, more preferably 4 to 12 h and most preferably 6 to 10 h.

The calcination is preferably in each case carried out by introducing the resultant mixtures into a high-temperature oven, for example a boron nitride vessel. The high-temperature oven is preferably a tubular furnace which contains a tray made from molybdenum foil.

After the calcination in step (b) or in step (ii), the compounds obtained are preferably treated with acid in order to wash out unreacted alkaline-earth metal nitride. The acid used is preferably hydrochloric acid. The powder obtained here is preferably suspended in 0.5 molar to 2 molar hydrochloric acid, more preferably about 1 molar hydrochloric acid, for 0.5 to 3 h, more preferably 0.5 to 1.5 h, subsequently filtered off and dried at a temperature in the range from 80 to 150° C.

In a further embodiment of the invention, the calcination and work-up, which can be carried out as described above by acid treatment, are again followed by a further calcination step. This is preferably carried out in a temperature range from 200 to 400° C., particularly preferably from 250 to 350° C. This further calcination step is preferably carried out under a reducing atmosphere. The duration of this calcination step is usually between 15 minutes and 10 h, preferably between 30 minutes and 2 h.

In still a further embodiment, the compounds obtained by one of the above-mentioned processes according to the invention can be coated. Suitable for this purpose are all coating methods as are known to the person skilled in the art from the prior art and are used for phosphors. Suitable materials for the coating are, in particular, metal oxides and nitrides, in particular alkaline-earth metal oxides, such as $Al_2O_3$, and alkaline-earth metal nitrides, such as AlN, and $SiO_2$. The coating can be carried out here, for example, by fluidised-bed methods. Further suitable coating methods are known from JP 04-304290, WO 91/10715, WO 99/27033, US 2007/0298250, WO 2009/065480 and WO 2010/075908.

The present invention furthermore relates to a post-treated europium-doped alkaline-earth metal siliconitride or silicooxynitride which is obtainable by one of the processes according to the invention. The compound prepared by the process according to the invention differs from compounds of the same or similar composition prepared in accordance with the prior art through the fact that it has higher emission efficiency. Owing to the complex structure of the compound according to the invention, the compound according to the invention cannot be unambiguously characterised by structural features. However, it can be distinguished unambiguously from compounds known from the prior art through the fact that it has higher radiation-induced emission efficiency or intensity and possibly a colour shift of the emission maximum compared with corresponding materials in which no further calcination step with an alkaline-earth metal nitride has been carried out.

An alkaline-earth metal silicooxynitride of the above-mentioned formula (Ia) is novel and is therefore a further subject-matter of the present invention. This compound is an essential starting material in the process according to the invention of the first embodiment. This compound furthermore corresponds, depending on the precise way in which the process is carried out and depending on the starting materials employed, to the reaction product after the post-treatment step.

The invention therefore furthermore relates to a compound of the formula (Ia), $$Ba_{2-a-b-c+1.5z}Sr_aCa_bEu_cSi_5N_{8-2/3x+z}O_x \cdot mSiO_2 \cdot nSi_3N_4 \quad \text{formula (Ia)}$$

where the indices used have the following meanings:
0≤a≤2;
0≤b≤2;
0.01≤c≤0.2, preferably 0.02≤c≤0.1;
0<x≤1, preferably 0.03≤x≤0.8, particularly preferably 0.1≤x≤0.6;
0≤z≤3.0, preferably 0≤z≤1.0, particularly preferably z=0;
0≤m≤2.50, preferably 0≤m≤1.00, particularly preferably m=0;
0≤n≤0.50, preferably n=0;
and a+b+c≤2+1.5z.

In the compounds of the formula (Ia), preferably m=0 or n=0, particularly preferably m=0 and n=0.

The above-mentioned preferences particularly preferably occur simultaneously in the compounds of the formula (Ia), i.e. these are preferably compounds for which:
0≤a≤2;
0≤b≤2;
0.02≤c≤0.1;
0.03≤x≤0.8;
0≤z≤1.0;
0≤m≤1.00;
n=0;
and a+b+c≤2+1.5z.

These are particularly preferably compounds for which:
0≤a≤2;
0≤b≤2;
0.02≤c≤0.1;
0.1≤x≤0.6;
z=0;
m=0;
n=0;
and a+b+c≤2+1.5z.

The present invention furthermore relates to the use of the post-treated europium-doped alkaline-earth metal siliconitride or silicooxynitride according to the invention or the compound of the above-mentioned formula (Ia) as phosphor, in particular as conversion phosphor.

The present invention furthermore relates to an emission-converting material comprising the post-treated europium-doped alkaline-earth metal siliconitride or silicooxynitride according to the invention or the compound of the formula (Ia). The emission-converting material may consist of the europium-doped alkaline-earth metal siliconitride or silicooxynitride according to the invention or the compound of the formula (Ia) and would in this case be equivalent to the term "conversion phosphor" defined above.

It is also possible for the emission-converting material according to the invention also to comprise further conversion phosphors besides the compound according to the invention. In this case, the emission-converting material according to the invention comprises a mixture of at least two conversion phosphors, where one thereof is a post-treated europium-doped alkaline-earth metal siliconitride or silicooxynitride according to the invention or a compound of the formula (Ia). It is particularly preferred for the at least two conversion phosphors to be phosphors which emit light of different wavelengths which are complementary to one another. If the post-treated europium-doped alkaline-earth metal siliconitride or silicooxynitride according to the invention or the compound of the formula (Ia) is a red-emitting phosphor, this is preferably employed in combination with a green- or yellow-emitting phosphor or also with a cyan- or blue-emitting phosphor. Alternatively, the red-emitting conversion phosphor according to the invention can also be employed in combination with (a) blue- and green-emitting conversion phosphor(s). Alternatively, the red-emitting conversion phosphor according to the invention can also be employed in combination with (a) green-emitting conversion phosphor(s). It may thus be preferred for the conversion phosphor according to the invention to be employed in combination with one or more further conversion phosphors in the emission-converting material according to the invention, which then together preferably emit white light.

In the context of this application, blue light is taken to mean light whose emission maximum is between 400 and 459 nm, cyan light is taken to mean light whose emission maximum is between 460 and 505 nm, green light is taken to mean light whose emission maximum is between 506 and 545 nm, yellow light is taken to mean light whose emission maximum is between 546 and 565 nm, orange light is taken to mean light whose emission maximum is between 566 and 600 nm and red light is taken to mean light whose emission maximum is between 601 and 670 nm. The post-treated europium-doped alkaline-earth metal siliconitride or silicooxynitride according to the invention or the compound of the formula (Ia) is preferably a red-emitting conversion phosphor.

The further conversion phosphor which can be employed together with the compound according to the invention can generally be any possible conversion phosphor. The following, for example, are suitable here: $Ba_2SiO_4:Eu^{2+}$, $BaSi_2O_5:Pb^{2+}$, $Ba_xSr_{1-x}F_2:Eu^{2+}$, $BaSrMgSi_2O_7:Eu^{2+}$, $BaTiP_2O_7$, $(Ba,Ti)_2P_2O_7:Ti$, $Ba_3WO_6:U$, $BaY_2F_8:Er^{3+}$, $Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+}$, $Mn^{2+}$, $CaAl_2O_4:Tb^{3+}$, $Ca_3Al_2Si_3O_{12}:Ce^{3+}$, $Ca_3Al_2Si_3Oi_2:Ce^{3+}$, $Ca_3Al_2Si_3O_2:Eu^{2+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+}$, $Mn^{2+}$, $Ca_2Ba_3(PO_4)_3Cl:Eu^{2+}$, $CaBr_2:Eu^{2+}$ in $SiO_2$, $CaCl_2:Eu^{2+}$ in $SiO_2$, $CaCl_2:Eu^{2+}$, $Mn^{2+}$ in $SiO_2$, $CaF_2:Ce^{3+}$, $CaF_2:Ce^{3+}$, $Mn^{2+}$, $CaF_2:Ce^{3+}$, $Tb^{3+}$, $CaF_2:Eu^{2+}$, $CaF_2:Mn^{2+}$, $CaF_2:U$, $CaGa_2O_4:Mn^{2+}$, $CaGa_4O_7:Mn^{2+}$, $CaGa_2S_4:Ce^{3+}$, $CaGa_2S_4:EU^{2+}$, $CaGa_2S_4:Mn^{2+}$, $CaGa_2S_4:Pb^{2+}$, $CaGeO_3:Mn^{2+}$, $CaI_2:Eu^{2+}$ in $SiO_2$, $CaI_2:Eu^{2+}$, $Mn^{2+}$ in $SiO_2$, $CaLaBO_4:Eu^{3+}$, $CaLaB_3O_7:Ce^{3+}$, $Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O_8:Eu^{2+}$, $Ca_2MgSi_2O_7:Eu^{2+}$, $CaMgSi_2O_6:Eu^{2+}$, $Mn^{2+}$, $Ca_2MgSi_2O_7:Eu^{2+}$, $Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Tl$, $CaO:Zn^{2+}$, $Ca_2P_2O_7:Ce^{3+}$, $\alpha\text{-}Ca_3(PO_4)_2:Ce^{3+}$, $\beta\text{-}Ca_3(PO_4)_2:Ce^{3+}$, $Ca_5(PO_4)_3Cl:Eu^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, $\beta\text{-}Ca_3(PO_4)_2:Eu^{2+}$, $Mn^{2+}$, $Ca_5(PO_4)_3F:Mn^{2+}$, $Ca_5(PO_4)_3F:Sb^{3+}$, $Ca_5(PO_4)_3F:Sn^{2+}$, $\alpha\text{-}Ca_3(PO_4)_2:Eu^{2+}$, $\beta\text{-}Ca_3(PO_4)_2:Eu^{2+}$, $Ca_2P_2O_7:Eu^{2+}$, $Ca_2P_2O_7:Eu^{2+}$, $Mn^{2+}$, $CaP_2O_6:Mn^{2+}$, $\alpha\text{-}Ca_3(PO_4)_2:Pb^{2+}$, $\alpha\text{-}Ca_3(PO_4)_2:Sn^{2+}$, $\beta\text{-}Ca_3(PO_4)_2:Sn^{2+}$, $\beta\text{-}Ca_2P_2O_7:Sn$, $Mn$, $\alpha\text{-}Ca_3(PO_4)_2:Tr$, $CaS:Bi^{3+}$, $CaS:Bi^{3+}$, $Na$, $CaS:Ce^{3+}$, $CaS:Eu^{2+}$, $CaS:Cu^+$, $Na^+$, $CaS:La^{3+}$, $CaS:Mn^{2+}$, $CaSO_4:Bi$, $CaSO_4:Ce^{3+}$, $CaSO_4:Ce^{3+}$, $Mn^{2+}$, $CaSO_4:Eu^{2+}$, $CaSO_4:Eu^{2+}$, $Mn^{2+}$, $CaSO_4:Pb^{2+}$, $CaS:Pb^{2+}$, $CaS:Pb^{2+}$, $Cl$, $CaS:Pb^{2+}$, $Mn^{2+}$, $CaS:Pr^{3+}$, $Pb^{2+}$, $Cl$, $CaS:Sb^{3+}$, $CaS:Sb^{3+}$, $Na$, $CaS:Sm^{3+}$, $CaS:Sn^{2+}$, $CaS:Sn^{2+}$, $F$, $CaS:Tb^{3+}$, $CaS:Tb^{3+}$, $Cl$, $CaS:Y^{3+}$, $CaS:Yb^{2+}$, $CaS:Yb^{2+}$, $Cl$, $CaSiO_3:Ce^{3+}$, $Ca_3SiO_4O_2:EU^{2+}$, $Ca_3SiO_4Cl_2:Pb^{2+}$, $CaSiO_3:EU^{2+}$, $CaSiO_3:Mn^{2+}$, $Pb$, $CaSiO_3:Pb^{2+}$, $CaSiO_3:Pb^{2+}$, $Mn^{2+}$, $CaSiO_3:Ti^{4+}$, $CaSr_2(PO_4)_2:Bi^{3+}$, $\beta\text{-}(Ca,Sr)_3(PO_4)_2:Sn^{2+}Mn^{2+}$, $CaTi_{0.9}Al_{0.1}O_3:Bi^{3+}$, $CaTiO_3:EU^{3+}$, $CaTiO_3:Pr^{3+}$, $Ca_5(VO_4)_3Cl$, $CaWO_4$, $CaWO_4Pb^{2+}$, $CaWO_4:W$, $Ca_3WO_6:U$, $CaYAlO_4:Eu^{3+}$, $CaYBO_4:Bi^{3+}$, $CaYBO_4:Eu^{3+}$, $CaYBO_{0.8}O_{3.7}:Eu^{3+}$, $CaY_2ZrO_6:Eu^{3+}$, $(Ca,Zn,Mg)_3(PO_4)_2:Sn$, $CeF_3$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag^+,Cr$, $CdS:In$, $CdS:In$, $CdS:In$, $Te$, $CdS:Te$, $CdWO_4$, $CsF$, $CsI$, $CsI:Na^+$, $CsI:Tl$, $(ErCl_3)_{0.25}(BaCl_2)_{0.75}$, $GaN:Zn$, $Gd_3Ga_5O_{12}:Cr^{3+}$, $Gd_3Ga_5O_{12}:Cr$, $Ce$, $GdNbO_4:Bi^{3+}$, $Gd_2O_2S:Eu^{3+}$, $Gd_2O_2Pr^{3+}$, $Gd_2O_2S:Pr$, $Ce$, $F$, $Gd_2O_2S:Tb^{3+}$, $Gd_2SiO_5:Ce^{3+}$, $KAl_{11}O_{17}:Tl^+$, $KGa_{11}O_{17}:Mn^{2+}$, $K_2La_2Ti_3O_{10}:Eu$, $KMgF_3:Eu^{2+}$, $KMgF_3:Mn^{2+}$, $K_2SiF_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $(La,Ce,Tb)PO_4:Ce:Tb$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^{3+}$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+}$, $Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+}$, $Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_6:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$, $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBa_2(PO_4)_2:U$, $MgBaP_2O_7:Eu^{2+}$, $MgBaP_2O_7:Eu^{2+}$, $Mn^{2+}$, $MgBa_3Si_2O_8:Eu^{2+}$, $MgBa(SO_4)_2:Eu^{2+}$, $Mg_3Ca(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+}$, $Mn^2$, $MgCeAl_nO_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $MgSrBa_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+}$, $Mn^{2+}$, $Mg_2Sr(SO_4)_3:Eu^{2+}$, $Mg_2TiO_4:Mn^{4+}$, $MgWO_4$, $MgYBO_4:Eu^{3+}$, $Na_3Ce(PO_4)_2:Tb^{3+}$, $NaI:Tl$, $Na_{1.23}K_{0.42}Eu_{0.12}TiSi_4O_{11}:Eu^{3+}$, $Na_{1.23}K_{0.42}Eu_{0.12}TiSi_5O_{13}\cdot xH_2O:Eu^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi_4O_{10}F_2:Mn$, $NaYF_4:Er^{3+}$, $Yb^{3+}$, $NaYO_2:Eu^{3+}$, $P46(70\%)+P47$ $(30\%)$, $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}(F,Cl,Br)$, $SrB_4O_7:Pb^{2+}$, $SrB_4O_7:Pb^{2+}$, $Mn^{2+}$, $SrB_8O_{13}:Sm^{2+}$, $Sr_xBa_yCl_zAl_2O_{4-z/2}:Mn^{2+}$, $Ce^{3+}$, $SrBaSiO_4:Eu^{2+}$, $Sr(Cl,Br,I)_2:Eu^{2+}$ in $SiO_2$, $SrCl_2:Eu^{2+}$ in $SiO_2$, $Sr_6Cl(PO_4)_3:Eu$, $Sr_wF_xB_4O_{6.5}:Eu^{2+}$, $Sr_wF_xB_yO_z:Eu^{2+}$, $Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $SrGa_2S_4:Pb^{2+}$, $SrIn_2O_4:Pr^{3+}$, $Al^{3+}$, $(Sr,Mg)_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $SrO\cdot3B_2O_3:Eu^{2+}Cl$, $\beta\text{-}SrO\cdot3B_2O_3:Pb^{2+}$, $\beta\text{-}SrO\cdot3B_2O_3:Pb^{2+}$, $Mn^{2+}$, $\alpha\text{-}SrO\cdot3B_2O_3:Sm^{2+}$, $Sr_6P_5BO_{20}:Eu$, $Sr_5(PO_4)_3Cl:Eu^{2+}$, $Sr_5(PO_4)_3Cl:Eu^{2+}$, $Pr^{3+}$, $Sr_6(PO_4)_3Cl:Mn^{2+}$, $Sr_5(PO_4)_3Cl:Sb^{3+}$, $Sr_2P_2O_7:Eu^{2+}$, $\beta\text{-}Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+},Mn^{2+}$, $Sr_5(PO_4)_3F:Sn^{2+}$, $Sr_2P_2O_7:Sn^{2+}$, $\beta\text{-}Sr_3(PO_4)_2:Sn^{2+}$, $\beta\text{-}Sr_3(PO_4)_2:Sn^{2+}$, $Mn^{2+}$ (Al), $SrS:Ce^{3+}$, $SrS:Eu^{2+}$, $SrS:Mn^{2+}$, $SrS:Cu^+$, $Na$, $SrSO_4:Bi$, $SrSO_4:Ce^{3+}$, $SrSO_4:Eu^{2+}$, $SrSO_4:Eu^{2+}$, $Mn^{2+}$, $Sr_6Si_4O_{10}Cl_6:Eu^{2+}$, $Sr_2SiO_4:Eu^{2+}$, $SrTiO_3:Pr^{3+}$, $SrTiO_3:Pr^{3+}$, $Al^{3+}$, $Sr_3WO_6:U$, $SrY_2O_3:Eu^{3+}$, $ThO_2:Eu^{3+}$, $ThO_2$:

$Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+}$, Mn, $YAl_3B_4O_{12}:Ce^{3+}$, $Tb^{3+}$, $YAl_3B_4O_{12}:Eu^{3+}$, $YAl_3B_4O_{12}:Eu^{3+}$, $Cr^{3+}$, $YAl_3B_4O_{12}:Th^{4+}$, $Ce^{3+}$, $Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}:Eu^{3+}$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_5O_{12}:Tb^{3+}$, $YAsO_4:Eu^{3+}$, $YBO_3:Ce^{3+}$, $YBO_3:Eu^{3+}$, $YF_3:Er^{3+}$, $Yb^{3+}$, $YF_3:Mn^{2+}$, $YF_3:Mn^{2+}$, $Th^{4+}$, $YF_3:Tm^{3+}$, $Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3(Eu, Pr)$, $Y_2O_3:Bi^{3+}$, $YOBnEu^{3+}$, $Y_2O_3:Ce$, $Y_2O_3:Er^{3+}$, $Y_2O_3:Eu^{3+}(YOE)$, $Y_2O_3:Ce^{3+}$, $Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+}$, $Tb^{3+}$, $YPO_4:Eu^{3+}$, $YPO_4:Mn^{2+}$, $Th^{4+}$, $YPO_4:V^{5+}$, $Y(P,V)O_4:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S:Ag$, $Zn_{0.6}Cd_{0.4}S:Ag$, $(Zn,Cd)S:Ag,Cl$, $(Zn,Cd)S:Cu$, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+},Ga^{3+}$, $ZnO:Bi^{3+}$, $ZnO:Ga^{3+}$, $ZnO:Ga$, $ZnO$—$CdO:Ga$, $ZnO:S$, $ZnO:Se$, $ZnO:Zn$, $ZnS:Ah^+$, $Cl^-$, $ZnS:Ag, Cu, Cl$, $ZnS:Ag, Ni$, $ZnS:Au, In$, $ZnS$—$CdS$ (25-75), $ZnS$—$CdS$ (50-50), $ZnS$—$CdS$ (75-25), $ZnS$—$CdS:Cu, Br, Ni$, $ZnS$—$CdS:Ag^+, Cl$, $ZnS$—$CdS:Cu, Br$, $ZnS$—$CdS:Cu, I$, $ZnS:Cl^-$, $ZnS:Eu^{2+}$, $ZnS:Cu$, $ZnS:Cu^+$, $Al^{3+}$, $ZnS:Cu^+$, $Cl^-$, $ZnS:Cu, Sn$, $ZnS:Eu^{2+}$, $ZnS:Mn^{2+}$, $ZnS:Mn, Cu$, $ZnS:Mn^{2+}$, $Te^{2+}$, $ZnS:P$, $ZnS:P^{3-}$, $Cl^-$, $ZnS:Pb^{2+}$, $ZnS:Pb^{2+}$, $Cl^-$, $ZnS:Pb, Cu$, $Zn_3(PO_4)_2:Mn^{2+}$, $Zn_2SiO_4:Mn^{2+}$, $Zn_2SiO_4:Mn^{2+}$, $As^{5+}$, $Zn_2SiO_4:Mn, Sb_2O_2$, $Zn_2SiO_4:Mn^{2+}$, $P$, $Zn_2SiO_4:Ti^{4+}$, $ZnS:Sn^{2+}$, $ZnS:Sn, Ag$, $ZnS:Sn^{2+}$, $Li^+$, $ZnS:Te, Mn$, $ZnS$—$ZnTe:Mn^{2+}$, $ZnSe:Cu^+$, $Cl$ or $ZnWO_4$.

The present invention furthermore relates to the use of the emission-converting material according to the invention in a light source. The light source is particularly preferably an LED, in particular a phosphor-converted LED, pc-LED for short. It is particularly preferred here for the emission-converting material to comprise at least one further conversion phosphor besides the conversion phosphor according to the invention, in particular so that the light source emits white light or light having a certain colour point (colour-on-demand principle). "Colour-on-demand principle" is taken to mean the achievement of light having a certain colour point by means of a pc-LED using one or more conversion phosphors.

The present invention thus furthermore relates to a light source which comprises a primary light source and the emission-converting material.

Here too, it is particularly preferred for the emission-converting material to comprise at least one further conversion phosphor besides the conversion phosphor according to the invention, so that the light source preferably emits white light or light having a certain colour point.

The light source according to the invention is preferably a pc-LED. A pc-LED generally comprises a primary light source and an emission-converting material. The emission-converting material according to the invention can for this purpose either be dispersed in a resin (for example epoxy or silicone resin) or, given suitable size ratios, arranged directly on the primary light source or remote therefrom, depending on the application (the latter arrangement also includes "remote phosphor technology").

The primary light source can be a semiconductor chip, a luminescent light source, such as ZnO, a so-called TCO (transparent conducting oxide), a ZnSe- or SiC-based arrangement, an arrangement based on an organic light-emitting layer (OLED) or a plasma or discharge source, most preferably a semiconductor chip. Possible forms of primary light sources of this type are known to the person skilled in the art.

If the primary light source is a semiconductor chip, it is preferably a luminescent indium aluminium gallium nitride (InAlGaN), as is known from the prior art.

Lasers are furthermore suitable as light source.

For use in light sources, in particular pc-LEDs, the emission-converting material according to the invention can also be converted into any desired outer shapes, such as spherical particles, flakes and structured materials and ceramics. These shapes are summarised under the term "shaped bodies". The shaped bodies are consequently emission-converting shaped bodies.

The invention furthermore relates to a lighting unit which contains at least one light source according to the invention. Lighting units of this type are employed principally in display devices, in particular liquid-crystal display devices (LC displays), having backlighting. The present invention therefore also relates to a display device of this type.

In the lighting unit according to the invention, the optical coupling between the emission-converting material and the primary light source (in particular semiconductor chip) is preferably effected by a light-conducting arrangement. This makes it possible for the primary light source to be installed at a central location and to be optically coupled to the emission-converting material by means of light-conducting devices, such as, for example, optical fibres. In this way, it is possible to achieve lamps adapted to the lighting wishes which consist of one or more different conversion phosphors, which may be arranged to form a light screen, and an optical waveguide, which is coupled to the primary light source. It is consequently possible to place a strong primary light source at a location which is favourable for electrical installation and to install lamps comprising emission-converting materials, which are coupled to the optical waveguides, at any desired locations without further electrical cabling, merely by laying optical waveguides.

The following examples and figures are intended to illustrate the present invention. However, they should in no way be regarded as limiting.

EXAMPLES

Figure 1:
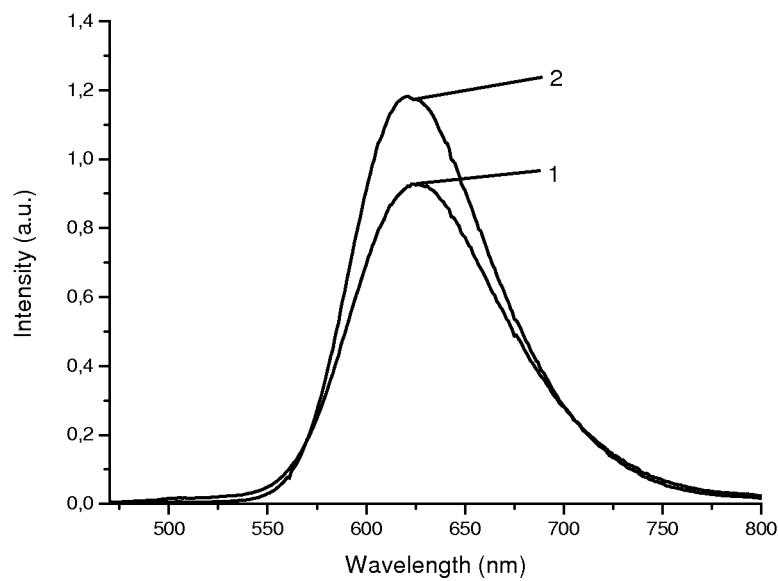
FIG. 1: Emission spectra of nitride phosphors prepared in different ways. The curve denoted by 1 shows the emission spectrum of a phosphor prepared in accordance with Comparative Example 1A), which was prepared by stoichiometric composition of the reaction mixture. The curve denoted by 2 shows the emission spectrum of a phosphor prepared in accordance with Comparative Example 1B), which was prepared with an excess of strontium nitride in a single calcination step.

General Procedure for Measurement of the Emission

The powder emission spectra are measured by the following general method: a loose phosphor powder bed having a depth of 5 mm whose surface has been smoothed using a glass plate is irradiated at a wavelength of 450 nm in the integration sphere of an Edinburgh Instruments FL 920 fluorescence spectrometer with a xenon lamp as excitation light source, and the intensity of the emitted fluorescence radiation in a range from 465 nm to 800 nm is measured in 1 nm steps.

Example 1

A) Comparative Example: Preparation of $Sr_2Si_5N_{7.666}O_{0.5}$:Eu (Stoichiometric Composition)

3.625 g (12.4 mmol) of strontium nitride, 4.438 g (31 mmol) of silicon nitride, 0.451 g (7.5 mmol) of silicon dioxide and 0.498 g (3.0 mmol) of europium nitride are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

B) Comparative Example: Preparation of $Sr_2Si_5N_{7.666}O_{0.5}$:Eu Using of a $Sr_3N_2$ Excess 9.452 g (32.333 mmol) of strontium nitride, 4.438 g (31 mmol) of silicon nitride, 0.451 g (7.5 mmol) of silicon dioxide and 0.498 g (3.0 mmol) of europium nitride are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

C) Preparation of $Sr_2Si_5N_{7.666}O_{0.5}$:Eu (Stoichiometric Composition) and Post-Calcination with Addition of $Sr_3N_2$ 3.625 g (12.4 mmol) of strontium nitride, 4.438 g (31 mmol) of silicon nitride, 0.451 g (7.5 mmol) of silicon dioxide and 0.498 g (3.0 mmol) of europium nitride are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

The phosphor obtained in this way is mixed with 20% by weight of strontium nitride and mixed until a homogeneous mixture forms. Another calcination is subsequently carried out, the conditions are identical to the first calcination step. In order to remove excess strontium nitride, the phosphor obtained in this way is suspended in 1 molar hydrochloric acid for 1 h, subsequently filtered off and dried.

Example 2

A) Comparative Example: Preparation of $Ba_2Si_5N_8$:Eu (Stoichiometric Composition)

7.223 g (16.333 mmol) of barium nitride, 5.964 g (41.666 mmol) of silicon nitride and 0.166 g (1.0 mmol) of europium nitride are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen hydrogen atmosphere (50 l/min of $N_2$+20 l/min of $H_2$).

B) Comparative Example: Preparation of $Ba_2Si_5N_8$:Eu Using an Excess of $Ba_3N_2$ 14.269 g (32.333 mmol) of barium nitride, 4.772 g (33.333 mmol) of silicon nitride and 0.166 g (1.0 mmol) of europium nitride are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

C) Preparation of $Ba_2Si_5N_8$:Eu (Stoichiometric Composition) and Post-Calcination with Addition of $Ba_3N_2$ 7.223 g (16.333 mmol) of barium nitride, 5.964 g (41.666 mmol) of silicon nitride and 0.166 g (1.0 mmol) of europium nitride are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

The phosphor obtained in this way is mixed with 20% by weight of barium nitride in a glove box and mixed until a homogeneous mixture forms. Another calcination is subsequently carried out, the conditions are identical to the first calcination step. In order to remove excess barium nitride, the phosphor obtained in this way is suspended in 1 molar hydrochloric acid for 1 h, subsequently filtered off and dried.

D) Preparation of $Ba_2Si_5N_8$:Eu (Stoichiometric Composition) and Post-Calcination with Addition of $Sr_3N_2$ 7.223 g (16.333 mmol) of barium nitride, 5.964 g (41.666 mmol) of silicon nitride and 0.166 g (1.0 mmol) of europium nitride are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

The phosphor obtained in this way is mixed with 20% by weight of strontium nitride in a glove box and mixed until a homogeneous mixture forms. Another calcination is subsequently carried out, the conditions are identical to the first calcination step. In order to remove excess barium nitride, the phosphor obtained in this way is suspended in 1 molar hydrochloric acid for 1 h, subsequently filtered off and dried.

Example 3

A) Comparative Example: Synthesis of $(Sr,Ba)_{1.90}Eu_{0.10}Si_5N_{7.67}O_{0.5}$ (Stoichiometric)

0.443 g of $Eu_2O_3$ (1.26 mmol), 3.500 g of $Ba_3N_2$ (7.95 mmol), 5.552 g of $Si_3N_4$ (39.58 mmol), 0.376 g of $SiO_2$ (6.25 mmol) and 2.313 g of $Sr_3N_2$ (7.95 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

B) Comparative Example: Synthesis of $(Sr,Ba)_{1.90}Eu_{0.10}Si_5N_{7.67}O_{0.5}$ (Excess)

0.443 g of $Eu_2O_3$ (1.26 mmol), 4.900 g of $Ba_3N_2$ (10.13 mmol), 5.552 g of $Si_3N_4$ (39.58 mmol), 0.376 g of $SiO_2$ (6.25 mmol) and 3.233 g of $Sr_3N_2$ (10.13 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$). In order to remove excess barium nitride and strontium nitride, the phosphor obtained in this way is suspended in 1 molar hydrochloric acid for 1 h, subsequently filtered off and dried.

C) Synthesis of $(Sr,Ba)_{1.90}Eu_{0.10}Si_5N_{7.67}O_{0.5}$—Post-Calcination 1.761 g of $Eu_2O_3$ (5 mmol), 28.008 g of $Ba_3N_2$ (63.336 mmol), 22.660 g of $Si_3N_4$ (158.300 mmol) and 1.502 g of $SiO_2$ (25.000 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

The phosphor obtained in this way is mixed with 20% by weight of strontium nitride and mixed until a homogeneous mixture forms. Another calcination is subsequently carried out, the conditions are identical to the first calcination step. In order to remove excess barium nitride, the phosphor obtained in this way is suspended in 1 molar hydrochloric acid for 1 h, subsequently filtered off and dried.

D) Synthesis of $(Sr,Ba)_{1.90}Eu_{0.10}Si_5N_{7.67}O_{0.5}$—Post-Calcination 1.761 g of $Eu_2O_3$ (5 mmol), 18.421 g of $Sr_3N_2$ (63.336 mmol), 22.660 g of $Si_3N_4$ (158.300 mmol) and 1.502 g of $SiO_2$ (25.000 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

The phosphor obtained in this way is mixed with 20% by weight of barium nitride in a glove box and mixed until a homogeneous mixture forms. Another calcination is subsequently carried out, the conditions are identical to the first calcination step. In order to remove excess strontium nitride, the phosphor obtained in this way is suspended in 1 molar hydrochloric acid for 1 h, subsequently filtered off and dried.

E) Synthesis of $(Sr,Ba)_{1.90}Eu_{0.10}Si_5N_{7.67}O_{0.5}$—Stoichiometric Composition and Subsequent Post-Calcination 0.443 g of $Eu_2O_3$ (1.26 mmol), 3.500 g of $Ba_3N_2$ (7.95 mmol), 5.552 g of $Si_3N_4$ (39.58 mmol), 0.376 g of $SiO_2$ (6.25 mmol) and 2.313 g of $Sr_3N_2$ (7.95 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

The phosphor obtained in this way is mixed with 20% by weight of a 1:1 mixture of strontium nitridebarium nitride and mixed until a homogeneous mixture forms. Another calcination is subsequently carried out, the conditions are identical to the first calcination step. In order to remove excess barium nitride and strontium nitride, the phosphor obtained in this way is suspended in 1 molar hydrochloric acid for 1 h, subsequently filtered off and dried.

F) $(Sr,Ca,Ba)_{1.92}Eu_{0.08}Si_5N_{7.67}O_{0.5}$—Post-Calcination 50 g of phosphor, described in Examples 3A)-3E), is mixed with 20% by weight of calcium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for 1 h, subsequently filtered off and dried.

Example 4

A) Comparative Example: $(Sr,Ca)_{1.92}Eu_{0.08}Si_5N_{7.67}O_{0.5}$—Stoichiometric Composition 2.115 g of $Eu_2O_3$ (6.00 mmol), 16.370 g (56.00 mmol) of $Sr_3N_2$, 33.998 g of $Si_3N_4$ (242.35 mmol), 5.930 g of $Ca_3N_2$ (40.00 mmol) and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

B) Comparative Example: $(Sr,Ca)_{1.92}Eu_{0.08}Si_5N_{7.67}O_{0.5}$—Excess 2.115 g of $Eu_2O_3$ (6.00 mmol), 23.560 g (81.00 mmol) of $Sr_3N_2$, 33.998 g of $Si_3N_4$ (242.35 mmol), 10.674 g of $Ca_3N_2$ (72.00 mmol) and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

C) $(Sr,Ca)_{1.92}Eu_{0.08}Si_5N_{7.67}O_{0.5}$—Stoichiometric Composition and Subsequent Post-Calcination 2.115 g of $Eu_2O_3$ (6.00 mmol), 16.370 g (56.00 mmol) of $Sr_3N_2$, 33.998 g of $Si_3N_4$ (242.35 mmol), 5.930 g of $Ca_3N_2$ (40.00 mmol) and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

60 g of the phosphor obtained in this way are mixed with 20% by weight of a mixture of 8.810 g of strontium nitride and 3.190 g of calcium nitride in a glove box and mixed until a homogeneous mixture forms. Another calcination is subsequently carried out, the conditions are identical to the first calcination step. In order to remove excess calcium nitride and strontium nitride, the phosphor obtained in this way is suspended in 1 molar hydrochloric acid for 1 h, subsequently filtered off and dried.

D) $(Sr,Ca)_{1.92}Eu_{0.08}Si_5N_{7.67}O_{0.5}$—Post-Calcination 2.115 g of $Eu_2O_3$ (6.00 mmol), 27.924 g (96.00 mmol) of $Sr_3N_2$, 33.998 g of $Si_3N_4$ (242.35 mmol), and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

60 g of the phosphor obtained in this way is mixed with 20% by weight of calcium nitride in a glove box and mixed until a homogeneous mixture forms. Another calcination is subsequently carried out, the conditions are identical to the first calcination step. In order to remove excess strontium nitride, the phosphor obtained in this way is suspended in 1 molar hydrochloric acid for 1 h, subsequently filtered off and dried.

E) $(Sr,Ca)_{1.92}Eu_{0.08}Si_5N_{7.67}O_{0.5}$—Post-Calcination 2.115 g of $Eu_2O_3$ (6.00 mmol), 14.232 g (96.00 mmol) of $Ca_3N_2$, 33.998 g of $Si_3N_4$ (242.35 mmol), and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

50 g of the phosphor obtained in this way are mixed with 20% by weight of strontium nitride in a glove box and mixed until a homogeneous mixture forms. Another calcination is subsequently carried out, the conditions are identical to the first calcination step. In order to remove excess strontium nitride, the phosphor obtained in this way is suspended in 1 molar hydrochloric acid for 1 h, subsequently filtered off and dried.

F) $(Sr,Ca,Ba)_{1.92}Eu_{0.08}Si_5N_{7.67}O_{0.5}$—Post-Calcination 50 g of phosphor, described in Examples 4A)-4E), are mixed with 20% by weight of barium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for 1 h, subsequently filtered off and dried.

Example 5

A) Comparative Example: $(Ca,Ba)_{1.92}Eu_{0.08}Si_5N_{7.67}O_{0.5}$—Stoichiometric Composition 2.115 g of $Eu_2O_3$ (6.00 mmol), 17.600 g (40.00 mmol) of $Ba_3N_2$, 33.998 g of $Si_3N_4$ (242.35 mmol), 8.302 g of $Ca_3N_2$ (56.00 mmol) and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

B) Comparative Example: $(Ca,Ba)_{1.92}Eu_{0.08}Si_5N_{7.67}O_{0.5}$—Excess 2.115 g of $Eu_2O_3$ (6.00 mmol), 27.940 g (63.50 mmol) of $Ba_3N_2$, 33.998 g of $Si_3N_4$ (242.35 mmol), 10.791 g of $Ca_3N_2$ (72.79 mmol) and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

C) $(Ca,Ba)_{1.92}Eu_{0.08}Si_5N_{7.67}O_{0.5}$—Stoichiometric Composition and Subsequent Post-Calcination 2.115 g of $Eu_2O_3$ (6.00 mmol), 17.600 g (40.00 mmol) of $Ba_3N_2$, 33.998 g of $Si_3N_4$ (242.35 mmol), 8.302 g of $Ca_3N_2$ (56.00 mmol) and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

60 g of the phosphor obtained in this way are mixed with 20% by weight of a mixture of 9.680 g of barium nitride and 2.320 g of calcium nitride in a glove box and mixed until a homogeneous mixture forms. Another calcination is subsequently carried out, the conditions are identical to the first calcination step. In order to remove excess calcium nitride and strontium nitride, the phosphor obtained in this way is suspended in 1 molar hydrochloric acid for 1 h, subsequently filtered off and dried.

D) $(Ca,Ba)_{1.92}Eu_{0.08}Si_5N_{7.67}O_{0.5}$—Post-Calcination 2.115 g of $Eu_2O_3$ (6.00 mmol), 42.240 g (96.00 mmol) of $Ba_3N_2$, 33.998 g of $Si_3N_4$ (242.35 mmol), and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

80 g of the phosphor obtained in this way are mixed with 20% by weight of calcium nitride in a glove box and mixed until a homogeneous mixture forms. Another calcination is subsequently carried out, the conditions are identical to the first calcination step. In order to remove excess barium nitride, the phosphor obtained in this way is suspended in 1 molar hydrochloric acid for 1 h, subsequently filtered off and dried.

E) $(Sr,Ca)_{1.92}Eu_{0.08}Si_5N_{7.67}O_{0.5}$—Post-Calcination 2.115 g of $Eu_2O_3$ (6.00 mmol), 14.232 g (96.00 mmol) of $Ca_3N_2$, 33.998 g of $Si_3N_4$ (242.35 mmol), and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

50 g of the phosphor obtained in this way are mixed with 20% by weight of barium nitride in a glove box and mixed until a homogeneous mixture forms. Another calcination is subsequently carried out, the conditions are identical to the first calcination step. In order to remove excess calcium nitride, the phosphor obtained in this way is suspended in 1 molar hydrochloric acid for 1 h, subsequently filtered off and dried.

F) $(Sr,Ca,Ba)_{1.92}Eu_{0.08}Si_5N_{7.67}O_{0.5}$—Post-Calcination 50 g of phosphor, described in Examples 5A)-5E), are mixed with 20% by weight of strontium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for 1 h, subsequently filtered off and dried.

Example 6

A) Comparative Example: $(Sr,Ca,Ba)_{1.92}Eu_{0.08}Si_5N_{7.67}O_{0.5}$—Stoichiometric Composition 2.115 g of $Eu_2O_3$ (6.00 mmol), 8.144 g (28.00 mmol) of $Sr_3N_2$, 33.998 g of $Si_3N_4$ (242.35 mmol), 5.930 g of $Ca_3N_2$ (40.00 mmol), 12.320 g (28.00 mmol) of $Ba_3N_2$ and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

B) Comparative Example: $(Sr, Ca, Ba)_{1.92}Eu_{0.08}Si_5N_{7.67}O_{0.5}$—Excess 2.115 g of $Eu_2O_3$ (6.00 mmol), 12.217 g (42.00 mmol) of $Sr_3N_2$, 33.998 g of $Si_3N_4$ (242.35 mmol), 8.895 g of $Ca_3N_2$ (60.00 mmol), 18.480 g (42.00 mmol) of $Ba_3N_2$ and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

C) $(Sr, Ba, Ca)_{1.92}Eu_{0.08}Si_5N_{7.67}O_{0.5}$—Stoichiometric Composition and Subsequent Post-Calcination 2.115 g of $Eu_2O_3$ (6.00 mmol), 8.144 g (28.00 mmol) of $Sr_3N_2$, 33.998 g of $Si_3N_4$ (242.35 mmol), 5.930 g of $Ca_3N_2$ (40.00 mmol), 12.320 g (28.00 mmol) of $Ba_3N_2$ and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

60 g of the phosphor obtained in this way are mixed with about 20% by weight of a mixture of 3.054 g of strontium nitride and 2.313 g of calcium nitride and 4.620 g of barium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for 1 h, subsequently filtered off and dried.

D) $(Sr,Ca,Ba)_{1.92}Eu_{0.08}Si_5N_{7.67}O_{0.5}$—Post-Calcination 2.115 g of $Eu_2O_3$ (6.00 mmol), 14.232 g (96.00 mmol) of $Ca_3N_2$, 33.998 g of $Si_3N_4$ (242.35 mmol), and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

50 g of the phosphor obtained in this way are mixed with about 20% by weight of a mixture of 4.000 g of strontium nitride and 6.000 g of barium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for 1 h, subsequently filtered off and dried.

E) $(Sr,Ca,Ba)_{1.92}Eu_{0.08}Si_5N_{7.67}O_{0.5}$—Post-Calcination 2.115 g of $Eu_2O_3$ (6.00 mmol), 27.924 g (96.00 mmol) of $Sr_3N_2$, 33.998 g of $Si_3N_4$ (242.35 mmol), and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

50 g of the phosphor obtained in this way are mixed with about 20% by weight of a mixture of 8.200 g of barium nitride and 1.800 g of calcium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for 1 h, subsequently filtered off and dried.

F) $(Sr,Ca,Ba)_{1.92}Eu_{0.08}Si_5N_{7.67}O_{0.5}$—Post-Calcination 2.115 g of $Eu_2O_3$ (6.00 mmol), 42.240 g (96.00 mmol) of $Ba_3N_2$, 33.998 g of $Si_3N_4$ (242.35 mmol), and 2.253 g (37.50 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$).

80 g of the phosphor obtained in this way are mixed with about 20% by weight of a mixture of 12.000 g of strontium nitride and 4.000 g of calcium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for 1 h, subsequently filtered off and dried.

Example 7

A) Comparative Example $(Ba)_{1.87}Eu_{0.03}Si_5N_{7.8}O_{0.2}$ 0.599 g of $Eu_2O_3$ (1.70 mmol), 32.811 g of $Ba_3N_2$ (74.57 mmol), 26.589 g of $Si_3N_4$ (189.6 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$). The phosphor obtained in this way is suspended in 1 molar hydrochloric acid for 1 h, subsequently filtered off and dried.

B) $(Ba)_{1.87}Eu_{0.03}Si_5N_{7.8}O_{0.2}$ 0.599 g of $Eu_2O_3$ (1.70 mmol), 32.811 g of $Ba_3N_2$ (74.57 mmol), 26.589 g of $Si_3N_4$ (189.6 mmol) are weighed out together in a glove box and mixed in a hand mortar until a homogeneous mixture forms. The phosphor obtained in this way is mixed with 20% by weight of barium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for a further 1 h, subsequently filtered off and dried.

C) $(Ba)_{1.87}Eu_{0.03}Si_5N_{7.8}O_{0.2}$ 0.599 g of $Eu_2O_3$ (1.70 mmol), 38.133 g of $Ba_3N_2$ (86.67 mmol), 26.589 g of $Si_3N_4$ (189.6 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$). In order to remove excess nitride, the phosphor obtained in this way is suspended in 1 molar hydrochloric acid for a further 1 h and subsequently filtered off and dried.

D) $(Ba)_{1.82}Eu_{0.03}Si_5N_{7.7}O_{0.3}$ 0.199 g of $Eu_2O_3$ (0.565 mmol), 10.985 g of $Ba_3N_2$ (24.97 mmol), 8.143 g of $Si_3N_4$ (58.10 mmol) and 0.817 g of $SiO_2$ (13.60 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen/hydrogen atmosphere (50 l/min of $N_2$+20 l/min of $H_2$). The phosphor obtained in this way is suspended in 1 molar hydrochloric acid for 1 h and subsequently filtered off and dried.

E) $(Ba)_{1.82}Eu_{0.03}Si_5N_{7.7}O_{0.3}$ 0.199 g of $Eu_2O_3$ (0.565 mmol), 10.985 g of $Ba_3N_2$ (24.97 mmol), 8.143 g of $Si_3N_4$ (58.10 mmol) and 0.817 g of $SiO_2$ (13.60 mmol) are weighed out together in a glove box and mixed in a hand mortar until a homogeneous mixture forms. The phosphor obtained in this way is mixed with 20 percent by weight of barium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for one hour, subsequently filtered off and dried.

F) $(Ba)_{1.82}Eu_{0.03}Si_5N_{7.7}O_{0.3}$ 0.199 g of $Eu_2O_3$ (0.565 mmol), 13.200 g of $Ba_3N_2$ (30.00 mmol), 8.143 g of $Si_3N_4$ (58.10 mmol) and 0.817 g of $SiO_2$ (13.60 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen hydrogen atmosphere (50 l/min of $N_2$+20 l/min of $H_2$). The phosphor obtained in this way suspended in 1 molar hydrochloric acid for a further 1 h, subsequently filtered off and dried.

G) $(Ba)_{1.87}Eu_{0.03}Si_5N_{7.8}O_{0.2}$ 0.199 g of $Eu_2O_3$ (0.565 mmol), 10.985 g of $Ba_3N_2$ (24.97 mmol), 8.881 g of $Si_3N_4$ (64.33 mmol) and 0.817 g $SiO_2$ (13.60 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen hydrogen atmosphere (50 l/min of $N_2$+20 l/min of $H_2$). The phosphor obtained in this way is suspended in 1 molar hydrochloric acid for 1 h, subsequently filtered off and dried.

H) $(Ba)_{1.87}Eu_{0.03}Si_5N_{7.8}O_{0.2}$ 0.199 g of $Eu_2O_3$ (0.565 mmol), 10.985 g of $Ba_3N_2$ (24.97 mmol), 8.881 g of $Si_3N_4$ (64.33 mmol) and 0.817 g of $SiO_2$ (13.60 mmol) are weighed out together in a glove box and mixed in a hand mortar until a homogeneous mixture forms. The phosphor obtained in this way is mixed with 20 percent by weight of barium nitride in a glove box and mixed until a homogeneous mixture forms. Another calcination is subsequently carried out, the conditions are identical to the first calcination step. The phosphor obtained in this way suspended in 1 molar hydrochloric acid for a further 1 h, subsequently filtered off and dried.

I) $(Ba)_{1.82}Eu_{0.03}Si_{7.7}N_{0.3}$ 0.199 g of $Eu_2O_3$ (0.565 mmol), 13.200 g of $Ba_3N_2$ (30.00 mmol), 8.881 g of $Si_3N_4$ (64.33 mmol) and 0.817 g of $SiO_2$ (13.60 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1600° C. under a nitrogen hydrogen atmosphere (50 l/min of $N_2$+20 l/min of $H_2$). The phosphor obtained in this way is suspended in 1 molar hydrochloric acid for 1 h, subsequently filtered off and dried.

Example 8

A) Comparative Example $(Sr,Ba)_{1.77}Eu_{0.08}Si_5N_{7.7}O_{0.3}$ 0.531 g of $Eu_2O_3$ (1.51 mmol), 4.200 g of $Ba_3N_2$ (9.54 mmol), 6.718 g of $Si_3N_4$ (47.90 mmol), 0.451 g of $SiO_2$ (7.50 mmol) and 2.775 g of $Sr_3N_2$ (9.54 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen/hydrogen atmosphere (70 l/min of $N_2$+10 l/min of $H_2$).

B) $(Sr,Ba)_{1.82}Eu_{0.08}Si_5N_{7.7}O_{0.2}$ 0.443 g of $Eu_2O_3$ (1.26 mmol), 3.500 g of $Ba_3N_2$ (7.95 mmol), 6.077 g of $Si_3N_4$ (43.33 mmol), 0.376 g of $SiO_2$ (6.25 mmol) and 2.313 g of $Sr_3N_2$ (7.95 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen hydrogen atmosphere (70 l/min of $N_2$+10 l/min of $H_2$). The phosphor obtained in this way is suspended in 1 molar hydrochloric acid for 1 h, subsequently filtered off and dried.

C) $(Sr,Ba)_{1.77}Eu_{0.08}Si_5N_{7.7}O_{0.3}$ 1.761 g of $Eu_2O_3$ (5 mmol), 28.008 g of $Ba_3N_2$ (63.336 mmol), 22.660 g of $Si_3N_4$ (158.300 mmol) and 1.502 g of $SiO_2$ (25.000 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen hydrogen atmosphere (70 l/min of $N_2$+10 l/min of $H_2$).

The phosphor obtained in this way is mixed with 20% by weight of strontium nitride in a glove box and mixed until a homogeneous mixture forms. Another calcination is subsequently carried out, which takes place for 8 h at 1625° C. under a nitrogen/hydrogen atmosphere (70 l/min of $N_2$+10 l/min of $H_2$). The phosphor obtained in this way is suspended in 1 molar hydrochloric acid for 1 h, subsequently filtered off and dried.

D) $(Sr,Ba)_{1.77}Eu_{0.08}Si_5N_{7.7}O_{0.3}$ 1.761 g of $Eu_2O_3$ (5 mmol), 18.421 g of $Sr_3N_2$ (63.336 mmol), 22.660 g of $Si_3N_4$ (158.300 mmol) and 1.502 g of $SiO_2$ (25.000 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen/hydrogen atmosphere (70 l/min of $N_2$+10 l/min of $H_2$).

The phosphor obtained in this way is mixed with 20% by weight of barium nitride in a glove box and mixed until a homogeneous mixture forms. Another calcination is subsequently carried out, the conditions are identical to the first calcination step. The phosphor obtained in this way is suspended in 1 molar hydrochloric acid for 1 h, subsequently filtered off and dried.

E) $(Sr,Ba)_{1.77}Eu_{0.08}Si_5N_{7.7}O_{0.3}$ 0.443 g of $Eu_2O_3$ (1.26 mmol), 4.900 g of $Ba_3N_2$ (10.13 mmol), 5.552 g of $Si_3N_4$ (39.58 mmol), 0.376 g of $SiO_2$ (6.25 mmol) and 3.233 g of $Sr_3N_2$ (10.13 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen/hydrogen atmosphere (70 l/min of $N_2$+20 l/min of $H_2$). The phosphor obtained in this way is suspended in 1 molar hydrochloric acid for 1 h, subsequently filtered off and dried.

F) $(Sr,Ba)_{1.82}Eu_{0.08}Si_5N_{7.8}O_{0.2}$ 1.761 g of $Eu_2O_3$ (5 mmol), 18.421 g of $Sr_3N_2$ (63.336 mmol), 23.840 g of $Si_3N_4$ (170.00 mmol) and 1.502 g of $SiO_2$ (25.000 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen/hydrogen atmosphere (70 l/min of $N_2$+10 l/min of $H_2$).

The phosphor obtained in this way is mixed with 20% by weight of barium nitride in a glove box and mixed until a homogeneous mixture forms. Another calcination is subsequently carried out, the conditions are identical to the first calcination step. The phosphor obtained in this way is suspended in 1 molar hydrochloric acid for 1 h, subsequently filtered off and dried.

G) $(Sr,Ba)_{1.77}Eu_{0.08}Si_5N_{7.7}O_{0.3}$ 1.330 g of $Eu_2O_3$ (3.78 mmol), 10.494 g of $Ba_3N_2$ (23.85 mmol), 6.937 g of $Si_3N_4$ (23.85 mmol), 1.127 g of $SiO_2$ (18.75 mmol) and 16.652 g of $Sr_3N_2$ (118.74 mmol) are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen/hydrogen atmosphere (60 l/min of $N_2$+15 l/min of $H_2$).

The phosphor obtained in this way is mixed with 20% by weight of a 1:1 mixture of strontium nitride barium nitride in a glove box and mixed until a homogeneous mixture forms. Another calcination is subsequently carried out, the conditions are identical to the first calcination step. In order to remove excess nitride, the phosphor is suspended in 1 molar hydrochloric acid for one hour, subsequently filtered off and dried.

Example 9

A) Comparative Example $(Ca,Ba)_{1.83}Eu_{0.07}Si_5N_{7.8}O_{0.2}$ 1.309 g of $Eu_2O_3$ (3.72 mmol), 18.979 g (43.13 mmol) of $Ba_3N_2$, 21.074 g of $Si_3N_4$ (150.33 mmol), 2.471 g of $Ca_3N_2$ (16.67 mmol) and 1.399 g (23.3 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1650° C. under a nitrogen/hydrogen atmosphere (70 l/min of $N_2$+10 l/min of $H_2$).

B) $(Ca,Ba)_{1.83}Eu_{0.07}Si_5N_{7.8}O_{0.2}$ 1.309 g of $Eu_2O_3$ (3.72 mmol), 26.312 g (59.80 mmol) of $Ba_3N_2$, 21.074 g of $Si_3N_4$ (150.33 mmol) and 1.399 g (23.3 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen/hydrogen atmosphere (70 l/min of $N_2$+10 l/min of $H_2$).

60 g of the phosphor obtained in this way are mixed with 5% by weight of calcium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for one hour, subsequently filtered off and dried.

C) $(Ca,Ba)_{1.83}Eu_{0.07}Si_5N_{7.8}O_{0.2}$ 21.309 g of $Eu_2O_3$ (3.72 mmol), 26.312 g (59.80 mmol) of $Ba_3N_2$, 21.074 g of $Si_3N_4$ (150.33 mmol) and 1.399 g (23.3 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen/hydrogen atmosphere (70 l/min of $N_2$+10 l/min of $H_2$).

80 g of the phosphor obtained in this way are mixed with 20% by weight of a proportionate mixture comprising a relative proportion of 80% of barium nitride and 20% of calcium nitride in a glove box and mixed until a homogeneous mixture forms. Another calcination is subsequently carried out, the conditions are identical to the first calcination step. The phosphor obtained in this way is suspended in 1 molar hydrochloric acid for 1 h, subsequently filtered off and dried.

D) $(Ca,Ba)_{1.83}Eu_{0.07}Si_5N_{7.8}O_{0.2}$ 21.309 g of $Eu_2O_3$ (3.72 mmol), 26.312 g (59.80 mmol) of $Ba_3N_2$, 21.074 g of $Si_3N_4$ (150.33 mmol) and 1.399 g (23.3 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen/hydrogen atmosphere (70 l/min of $N_2$+10 l/min of $H_2$).

80 g of the phosphor obtained in this way are mixed with 20% by weight of a proportionate mixture comprising a relative proportion of 90% of barium nitride and 10% of calcium nitride in a glove box and mixed until a homogeneous mixture forms. Another calcination is subsequently carried out, the conditions are identical to the first calcination step. The phosphor obtained in this way is suspended in 1 molar hydrochloric acid for 1 h, subsequently filtered off and dried.

E) $(Ba,Ca)_{1.83}Eu_{0.07}Si_5N_{7.8}O_{0.2}$ 1.309 g of $Eu_2O_3$ (3.72 mmol), 8.865 g (59.80 mmol) of $Ca_3N_2$, 21.074 g of $Si_3N_4$ (150.33 mmol) and 1.399 g (23.3 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1650° C. under a nitrogen/hydrogen atmosphere (70 l/min of $N_2$+10 l/min of $H_2$).

50 g of the phosphor obtained in this way are mixed with 20% by weight of barium nitride in a glove box and mixed until a homogeneous mixture forms. Another calcination is subsequently carried out, the conditions are identical to the first calcination step. The phosphor obtained in this way is suspended in 1 molar hydrochloric acid for 1 h, subsequently filtered off and dried.

F) $(Ca,Ba)_{1.83}Eu_{0.07}Si_5N_{7.8}O_{0.2}$ 1.309 g of $Eu_2O_3$ (3.72 mmol), 20.534 g (46.67 mmol) of $Ba_3N_2$, 2.965 g of $Ca_3N_2$ (20.00 mmol), 21.074 g of $Si_3N_4$ (150.33 mmol) and 1.399 g (23.3 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 8 h at 1625° C. under a nitrogen/hydrogen atmosphere (70 l/min of $N_2$+10 l/min of $H_2$). The phosphor obtained in this way is suspended in 1 molar hydrochloric acid for 1 h, subsequently filtered off and dried.

Example 10

A) Comparative Example $(Sr,Ca, Ba)_{1.83}Eu_{0.07}Si_5N_{7.8}O_{0.2}$ 0.757 g of $Eu_2O_3$ (2.15 mmol), 1.939 g (6.67 mmol) of $Sr_3N_2$, 8.125 g (18.47 mmol) of $Ba_3N_2$, 1.483 g (10.00 mmol) of $Ca_3N_2$, 13.183 g of $Si_3N_4$ (94.00 mmol), and 0.601 g (10.00 mmol) of $SiO_2$ are weighed out together in a glove box and mixed in a hand mortar until a homogeneous mixture forms. The mixture is transferred into a boron nitride boat and placed centrally on a molybdenum foil tray in a tubular furnace and calcined for 6 h at 1600° C. under a nitrogen/hydrogen atmosphere (50 l/min of $N_2$+20 l/min of $H_2$).

B) $(Sr, Ba, Ca)_{1.83}Eu_{0.07}Si_5N_{7.8}O_{0.2}$ 0.757 g of $Eu_2O_3$ (2.15 mmol), 1.939 g (6.67 mmol) of $Sr_3N_2$, 8.125 g (18.47 mmol) of $Ba_3N_2$, 1.483 g (10.00 mmol) of Ca$_3$N$_2$, 13.183 g of Si$_3$N$_4$ (94.00 mmol), and 0.601 g (10.00 mmol) of SiO$_2$ are weighed out together in a glove box and mixed in a hand mortar until a homogeneous mixture forms. The mixture is transferred into a boron nitride boat and placed centrally on a molybdenum foil tray in a tubular furnace and calcined for 6 h at 1600° C. under a nitrogen/hydrogen atmosphere (50 l/min of N$_2$+20 l/min of H$_2$).

60 g of the phosphor obtained in this way are mixed with about 20% by weight of a mixture of 1.940 g of strontium nitride and 1.460 g of calcium nitride and 8.600 g of barium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for a further 1 h, subsequently filtered off and dried.

C) (Sr, Ca, Ba)$_{1.83}$Eu$_{0.07}$Si$_5$N$_{7.8}$O$_{0.2}$ 0.757 g of Eu$_2$O$_3$ (2.15 mmol), 2.133 g (7.33 mmol) of Sr$_3$N$_2$, 8.800 g (20.00 mmol) of Ba$_3$N$_2$, 1.631 g (11.00 mmol) of Ca$_3$N$_2$, 13.183 g of Si$_3$N$_4$ (94.00 mmol), and 0.601 g (10.00 mmol) of SiO$_2$ are weighed out together in a glove box and mixed in a hand mortar until a homogeneous mixture forms. The mixture is transferred into a boron nitride boat and placed centrally on a molybdenum foil tray in a tubular furnace and calcined for 6 h at 1625° C. under a nitrogen/hydrogen atmosphere (50 l/min of N$_2$+20 l/min of H$_2$). The phosphor obtained in this way is suspended in 1 molar hydrochloric acid for 1 h, subsequently filtered off and dried.

D) (Sr,Ca,Ba)$_{1.83}$Eu$_{0.07}$Si$_5$N$_{7.8}$O$_{0.2}$ 0.757 g of Eu$_2$O$_3$ (2.15 mmol), 15.459 g (35.13 mmol) of Ba$_3$N$_2$, 13.183 g of Si$_3$N$_4$ (94.00 mmol), and 0.601 g (10.00 mmol) of SiO$_2$ are weighed out together in a glove box and mixed in a hand mortar until a homogeneous mixture forms. The mixture is transferred into a boron nitride boat and placed centrally on a molybdenum foil tray in a tubular furnace and calcined for 6 h at 1600° C. under a nitrogen/hydrogen atmosphere (50 l/min of N$_2$+20 l/min of H$_2$).

80 g of the phosphor obtained in this way are mixed with around 20% by weight of a mixture of 10.000 g of strontium nitride and 6.000 g of calcium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for a further 1 h, subsequently filtered off and dried.

E) (Sr,Ca,Ba)$_{1.83}$Eu$_{0.07}$Si$_5$N$_{7.8}$O$_{0.2}$ 0.757 g of Eu$_2$O$_3$ (2.15 mmol), 5.209 g (35.13 mmol) of Ca$_3$N$_2$, 13.183 g of Si$_3$N$_4$ (94.00 mmol), and 0.601 g (10.00 mmol) of SiO$_2$ are weighed out together in a glove box and mixed in a hand mortar until a homogeneous mixture forms. The mixture is transferred into a boron nitride boat and placed centrally on a molybdenum foil tray in a tubular furnace and calcined for 6 h at 1600° C. under a nitrogen/hydrogen atmosphere (50 l/min of N$_2$+20 l/min of H$_2$).

50 g of the phosphor obtained in this way are mixed with around 20% by weight of a mixture of 4.000 g of strontium nitride and 6.000 g of barium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for a further 1 h, subsequently filtered off and dried.

F) (Sr,Ca,Ba)$_{1.83}$Eu$_{0.07}$Si$_5$N$_{7.8}$O$_{0.2}$ 0.757 g of Eu$_2$O$_3$ (2.15 mmol), 10.219 g (35.13 mmol) of Sr$_3$N$_2$, 13.183 g of Si$_3$N$_4$ (94.00 mmol), and 0.601 g (10.00 mmol) of SiO$_2$ are weighed out together in a glove box and mixed in a hand mortar until a homogeneous mixture forms. The mixture is transferred into a boron nitride boat and placed centrally on a molybdenum foil tray in a tubular furnace and calcined for 6 h at 1625° C. under a nitrogen/hydrogen atmosphere (50 l/min of N$_2$+20 l/min of H$_2$).

50 g of the phosphor obtained in this way are mixed with around 20% by weight of a mixture of 8.200 g of barium nitride and 1.800 g of calcium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for 1 h, subsequently filtered off and dried.

G) (Sr,Ca,Ba)$_{1.83}$Eu$_{0.07}$Si$_5$N$_{7.8}$O$_{0.2}$ 0.757 g of Eu$_2$O$_3$ (2.15 mmol), 2.133 g (7.33 mmol) of Sr$_3$N$_2$, 8.800 g (20.00 mmol) of Ba$_3$N$_2$, 1.156 g (7.80 mmol) of Ca$_3$N$_2$, 13.183 g of Si$_3$N$_4$ (94.00 mmol), and 0.601 g (10.00 mmol) of SiO$_2$ are weighed out together in a glove box and mixed in a hand mortar until a homogeneous mixture forms. The mixture is transferred into a boron nitride boat and placed centrally on a molybdenum foil tray in a tubular furnace and calcined for 6 h at 1600° C. under a nitrogen/hydrogen atmosphere (50 l/min of N$_2$+20 l/min of H$_2$).

80 g of the phosphor obtained in this way are mixed with around 20% by weight of a mixture of 10.000 g of barium nitride, 2.000 g of strontium nitride and 4.000 g of calcium nitride in a glove box and mixed until a homogeneous mixture forms. Another calcination is subsequently carried out, the conditions are identical to the first calcination step. In order to remove excess nitride, the phosphor obtained in this way is suspended in 1 molar hydrochloric acid for a further 1 h, subsequently filtered off and dried.

Example 11

Coating of the Phosphors

A) Coating of the Phosphors According to the Invention with SiO$_2$ 50 g of one of the phosphors according to the invention described above are suspended in 1 liter of ethanol in a 2 l reactor with ground-glass lid, heating mantle and reflux condenser. A solution of 17 g of ammonia water (25% by weight of NH$_3$) in 70 ml of water and 100 ml of ethanol is added. A solution of 48 g of tetraethyl orthosilicate (TEOS) in 48 g of anhydrous ethanol is slowly added dropwise (about 1.5 ml/min) at 65° C. with stirring. When the addition is complete, the suspension is stirred for a further 1.5 h, brought to room temperature and filtered off. The residue is washed with ethanol and dried at 150° C. to 200° C.

B) Coating of the Phosphors According to the Invention with $Al_2O_3$ 50 g of one of the phosphors according to the invention described above are suspended in 950 g of ethanol in a glass reactor with heating mantle. 600 g of an ethanolic solution of 98.7 g of $AlCl_3*6H_2O$ per kg of solution are metered into the suspension over 3 h with stirring at 80° C. During this addition, the pH is kept constant at 6.5 by metered addition of sodium hydroxide solution. When the metered addition is complete, the mixture is stirred at 80° C. for a further 1 h, then cooled to room temperature, the phosphor is filtered off, washed with ethanol and dried.

C) Coating of the Phosphors According to the Invention with $B_2O_3$ 50 g of one of the phosphors according to the invention described above are suspended in 1000 ml of water in a glass reactor with heating mantle. The suspension is heated to 60° C., and 4.994 g of boric acid $H_3BO_3$ (80 mmol) are added with stirring. The suspension is cooled to room temperature with stirring and subsequently stirred for 1 h. The suspension is then filtered off with suction and dried in a drying cabinet. After drying, the material is calcined at 500° C. under a nitrogen atmosphere.

D) Coating of the Phosphors According to the Invention with BN 50 g of one of the phosphors according to the invention described above are suspended in 1000 ml of water in a glass reactor with heating mantle. The suspension is heated to 60° C., and 4.994 g of boric acid $H_3BO_3$ (80 mmol) are added with stirring. The suspension is cooled to room temperature with stirring and subsequently stirred for 1 h. The suspension is then filtered off with suction and dried in a drying cabinet. After drying, the material is calcined at 1000° C. under a nitrogenammonia atmosphere.

E) Coating of the Phosphors According to the Invention with $ZrO_2$ 50 g of one of the phosphors according to the invention described above are suspended in 1000 ml of water in a glass reactor with heating mantle. The suspension is heated to 60° C. and adjusted to pH 3.0. 10 g of a 30 percent by weight $ZrOCl_2$ solution are subsequently metered in slowly with stirring. When the metered addition is complete, the mixture is stirred for a further 1 h, subsequently filtered off with suction and washed with DI water. After drying, the material is calcined at 600° C. under a nitrogen atmosphere.

F) Coating of the Phosphors According to the Invention with MgO 50 g of one of the phosphors according to the invention described above are suspended in 1000 ml of water in a glass reactor with heating mantle. The suspension is held at a temperature of 25° C., and 19.750 g of ammonium hydrogencarbonate (250 mmol) are added. 100 ml of a 15 percent by weight magnesium chloride solution are added slowly. When the metered addition is complete, the mixture is stirred for a further 1 h, subsequently filtered off with suction and washed with DI water. After drying, the material is calcined at 1000° C. under a nitrogen/hydrogen atmosphere.

Example 12

Thermal Post-Calcination 50 g of one of the phosphors described above are transferred into an Alsint calcination crucible and subsequently subjected to reductive calcination. The calcination here is carried out at 300° C. under a nitrogen/hydrogen atmosphere. The hydrogen proportion is up to 10 percent by volume. After cooling, the phosphor according to the invention is briefly mortared carefully and subsequently sieved, and characterised in greater detail.

Example 13

Production of a Pc-LED Using a Phosphor Prepared in Accordance with the Invention, Which has a Correlated Colour Temperature (CCT) of 3000 K 1 g of the red phosphor described in Example 8C) having a maximum of the emission wavelength of 620 nm is weighed out together with 8 g of a green phosphor having the composition $Lu_{2.976}Ce_{0.024}Al_5O_{12}$ and mixed homogeneously in a planetary centrifugal mixer. Optically transparent silicone is subsequently added to the mixture and mixed so that the phosphor concentration is 14 wt. %. The silicone/phosphor mixture obtained in this way is applied to the chip of a blue semiconductor LED with the aid of an automatic dispenser and cured with supply of heat. The blue semiconductor LEDs used for the LED characterisation have an emission wavelength of 442 nm and are operated with a current strength of 350 mA. The photometric characterisation of the LED is carried out using an Instrument Systems spectrometer—spectrometer CAS 140 and a connected ISP 250 integration sphere. The LED is characterised via the determination of the wavelength-dependent spectral power density. The resultant spectrum of the light emitted by the LED is used for further calculations of characteristic properties of the LED. These are the colour point coordinates CIE x and y, the luminance in lumens and the general colour rendition index Ra.

Example 14

Production of a Pc-LED Using a Phosphor Prepared in Accordance with the Invention, Which has a Correlated Colour Temperature (CCT) of 5000 K 1 g of the red phosphor described in Example 8C) having a maximum of the emission wavelength of 620 nm is weighed out together with 19 g of a green phosphor having the composition $Lu_{2.976}Ce_{0.024}Al_5O_{12}$ and mixed homogeneously in a planetary centrifugal mixer. Optically transparent silicone is subsequently added to the mixture and mixed so that the phosphor concentration is 12 wt. %. The silicone/phosphor mixture obtained in this way is applied to the chip of a blue semiconductor LED with the aid of an automatic dispenser and cured with supply of heat. The blue semiconductor LEDs used for the LED characterisation have an emission wavelength of 442 nm and are operated with a current strength of 350 mA. The photometric characterisation of the LED is carried out using an Instrument Systems spectrometer—CAS 140 spectrometer and a connected ISP 250 integration sphere. The LED is characterised via the determination of the wavelength-dependent spectral power density. The resultant spectrum of the light emitted by the LED is used for further calculations of characteristic properties of the LED. These are the colour point coordinates CIE x and y, the luminance in lumens and the general colour rendition index Ra.

Example 15

Production of a Pc-LED Using a Phosphor Prepared in Accordance with the Invention, which has a Correlated Colour Temperature (CCT) of 6500 K 1 g of the red phosphor described in Example 8C) having a maximum of the emission wavelength of 620 nm is weighed out together with 21 g of a green phosphor having the composition $Lu_{2.976}Ce_{0.024}Al_5O_{12}$ and mixed homogeneously in a planetary centrifugal mixer. Optically transparent silicone is subsequently added to the mixture and mixed so that the phosphor concentration is 10 wt. %. The silicone phosphor mixture obtained in this way is applied to the chip of a blue semiconductor LED with the aid of an automatic dispenser and cured with supply of heat. The blue semiconductor LEDs used for the LED characterisation have an emission wavelength of 442 nm and are operated with a current strength of 350 mA. The photometric characterisation of the LED is carried out using an Instrument Systems spectrometer—spectrometer CAS 140 and a connected ISP 250 integration sphere. The LED is characterised via the determination of the wavelength-dependent spectral power density. The resultant spectrum of the light emitted by the LED is used for further calculations of characteristic properties of the LED. These are the colour point coordinates CIE x and y, the luminance in lumens and the general colour rendition index Ra.

Example 16

Production of a Pc-LED Using a Phosphor Prepared in Accordance with the Invention, which has a Correlated Colour Temperature (CCT) of 3000 K 1 g of the red phosphor described in Example 6F) having a maximum of the emission wavelength of 630 nm is weighed out together with 12 g of a green phosphor having the composition $Lu_{2.976}Ce_{0.024}Al_5O_{12}$ and mixed homogeneously in a planetary centrifugal mixer. Optically transparent silicone is subsequently added to the mixture and mixed so that the phosphor concentration is 17 wt. %. The silicone/phosphor mixture obtained in this way is applied to the chip of a blue semiconductor LED with the aid of an automatic dispenser and cured with supply of heat. The blue semiconductor LEDs used for the LED characterisation have an emission wavelength of 442 nm and are operated with a current strength of 350 mA. The photometric characterisation of the LED is carried out using an Instrument Systems spectrometer—spectrometer CAS 140 and a connected ISP 250 integration sphere. The LED is characterised via the determination of the wavelength-dependent spectral power density. The resultant spectrum of the light emitted by the LED is used for further calculations of characteristic properties of the LED. These are the colour point coordinates CIE x and y, the luminance in lumens and the general colour rendition index Ra.

Example 17

Production of a Pc-LED Using a Phosphor Prepared in Accordance with the Invention, which has a Correlated Colour Temperature (CCT) of 5000 K 1 g of the red phosphor described in Example 6F) having a maximum of the emission wavelength of 630 nm is weighed out together with 21 g of a green phosphor having the composition $Lu_{2.976}Ce_{0.024}Al_5O_{12}$ and mixed homogeneously in a planetary centrifugal mixer. Optically transparent silicone is subsequently added to the mixture and mixed so that the phosphor concentration is 13.5 wt. %. The silicone/phosphor mixture obtained in this way is applied to the chip of a blue semiconductor LED with the aid of an automatic dispenser and cured with supply of heat. The blue semiconductor LEDs used for the LED characterisation have an emission wavelength of 442 nm and are operated with a current strength of 350 mA. The photometric characterisation of the LED is carried out using an Instrument Systems spectrometer—spectrometer CAS 140 and a connected ISP 250 integration sphere. The LED is characterised via the determination of the wavelength-dependent spectral power density. The resultant spectrum of the light emitted by the LED is used for further calculations of characteristic properties of the LED. These are the colour point coordinates CIE x and y, the luminance in lumens and the general colour rendition index Ra.

Example 18

Production of a Pc-LED Using a Phosphor Prepared in Accordance with the Invention, which has a Correlated Colour Temperature (CCT) of 6500 K 1 g of the red phosphor described in Example 6F) having a maximum of the emission wavelength of 630 nm is weighed out together with 23 g of a green phosphor having the composition $Lu_{2.976}Ce_{0.024}Al_5O_{12}$ and mixed homogeneously in a planetary centrifugal mixer. Optically transparent silicone is subsequently added to the mixture and mixed so that the phosphor concentration is 12 wt. %. The silicone/phosphor mixture obtained in this way is applied to the chip of a blue semiconductor LED with the aid of an automatic dispenser and cured with supply of heat. The blue semiconductor LEDs used for the LED characterisation have an emission wavelength of 442 nm and are operated with a current strength of 350 mA. The photometric characterisation of the LED is carried out using an Instrument Systems spectrometer—spectrometer CAS 140 and a connected ISP 250 integration sphere. The LED is characterised via the determination of the wavelength-dependent spectral power density. The resultant spectrum of the light emitted by the LED is used for further calculations of characteristic properties of the LED. These are the colour point coordinates CIE x and y, the luminance in lumens and the general colour rendition index Ra.

Example 19

Production of a Pc-LED Using a Phosphor Prepared in Accordance with the Invention, which has a Correlated Colour Temperature (CCT) of 3000 K 1 g of the red phosphor described in Example 5C) having a maximum of the emission wavelength of 650 nm is weighed out together with 4.5 g of a green phosphor having the composition $Lu_{2.976}Ce_{0.024}Al_5O_{12}$ and mixed homogeneously in a planetary centrifugal mixer. Optically transparent silicone is subsequently added to the mixture and mixed so that the phosphor concentration is 21 wt. %. The silicone/phosphor mixture obtained in this way is applied to the chip of a blue semiconductor LED with the aid of an automatic dispenser and cured with supply of heat. The blue semiconductor LEDs used for the LED characterisation have an emission wavelength of 442 nm and are operated with a current strength of 350 mA. The photometric characterisation of the LED is carried out using an Instrument Systems spectrometer—spectrometer CAS 140 and a connected ISP 250 integration sphere. The LED is characterised via the determination of the wavelength-dependent spectral power density. The resultant spectrum of the light emitted by the LED is used for further calculations of characteristic properties of the LED. These are the colour point coordinates CIE x and y, the luminance in lumens and the general colour rendition index Ra.

Example 20

Production of a Pc-LED Using a Phosphor Prepared in Accordance with the Invention, which has a Correlated Colour Temperature (CCT) of 5000 K 1 g of the red phosphor described in Example 5C) having a maximum of the emission wavelength of 650 nm is weighed out together with 7.5 g of a green phosphor having the composition $Lu_{2.976}Ce_{0.024}Al_5O_{12}$ and mixed homogeneously in a planetary centrifugal mixer. Optically transparent silicone is subsequently added to the mixture and mixed so that the phosphor concentration is 18 wt. %. The silicone/phosphor mixture obtained in this way is applied to the chip of a blue semiconductor LED with the aid of an automatic dispenser and cured with supply of heat. The blue semiconductor LEDs used for the LED characterisation have an emission wavelength of 442 nm and are operated with a current strength of 350 mA. The photometric characterisation of the LED is carried out using an Instrument Systems spectrometer—spectrometer CAS 140 and a connected ISP 250 integration sphere. The LED is characterised via the determination of the wavelength-dependent spectral power density. The resultant spectrum of the light emitted by the LED is used for further calculations of characteristic properties of the LED. These are the colour point coordinates CIE x and y, the luminance in lumens and the general colour rendition index Ra.

Example 21

Production of a Pc-LED Using a Phosphor Prepared in Accordance with the Invention, which has a Correlated Colour Temperature (CCT) of 6500 K 1 g of the red phosphor described in Example 5C) having a maximum of the emission wavelength of 650 nm is weighed out together with 8 g of a green phosphor having the composition $Lu_{2.976}Ce_{0.024}Al_5O_{12}$ and mixed homogeneously in a planetary centrifugal mixer. Optically transparent silicone is subsequently added to the mixture and mixed so that the phosphor concentration is 15 wt. %. The silicone/phosphor mixture obtained in this way is applied to the chip of a blue semiconductor LED with the aid of an automatic dispenser and cured with supply of heat. The blue semiconductor LEDs used for the LED characterisation have an emission wavelength of 442 nm and are operated with a current strength of 350 mA. The photometric characterisation of the LED is carried out using an Instrument Systems spectrometer—spectrometer CAS 140 and a connected ISP 250 integration sphere. The LED is characterised via the determination of the wavelength-dependent spectral power density. The resultant spectrum of the light emitted by the LED is used for further calculations of characteristic properties of the LED. These are the colour point coordinates CIE x and y, the luminance in lumens and the general colour rendition index Ra.

Example 22

A) Production of a Pc-LED which Comprises Exclusively a Red Phosphor According to Example 8A)

Optically transparent silicone is added to 0.175 g of the red phosphor described in Example 8A) and mixed so that the phosphor concentration is 1.75 wt. %. The silicone/phosphor mixture obtained in this way is applied to the chip of a blue semiconductor LED with the aid of an automatic dispenser and cured with supply of heat. The blue semiconductor LEDs used for the LED characterisation have an emission wavelength of 442 nm and are operated with a current strength of 350 mA. The photometric characterisation of the LED is carried out using an Instrument Systems spectrometer—spectrometer CAS 140 and a connected ISP 250 integration sphere. The LED is characterised via the determination of the wavelength-dependent spectral power density. The resultant spectrum of the light emitted by the LED is used for further calculations of characteristic properties of the LED.

B) Production of a Pc-LED which Comprises Exclusively a Red Phosphor According to Example 8C)

The production of the pc-LED and the characterisation thereof are carried out in accordance with Example 22A), but using the red phosphor described in Example 8C).

Figure 2:
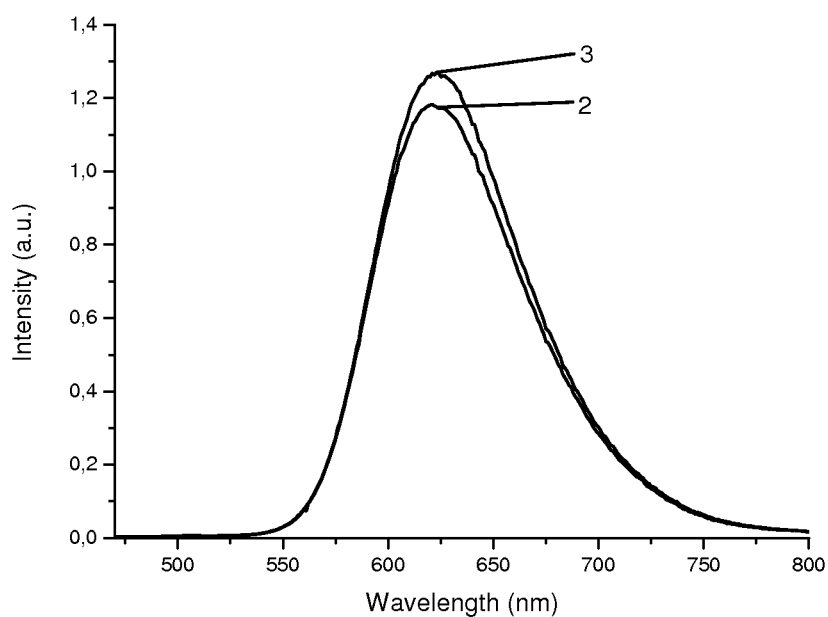
FIG. 2: Emission spectra of nitride phosphors prepared in different ways. The curve denoted by 2 shows an emission spectrum of a phosphor prepared in accordance with Comparative Example 1B), which was prepared with an excess of strontium nitride in a single calcination step. The curve denoted by 3 shows an emission spectrum of a phosphor according to the invention prepared in accordance with Example 1C), which was prepared by stoichiometric preparation of the phosphor in the first calcination step and subsequent post-calcination of the phosphor with addition of 20% by weight of strontium nitride.
Figure 3:
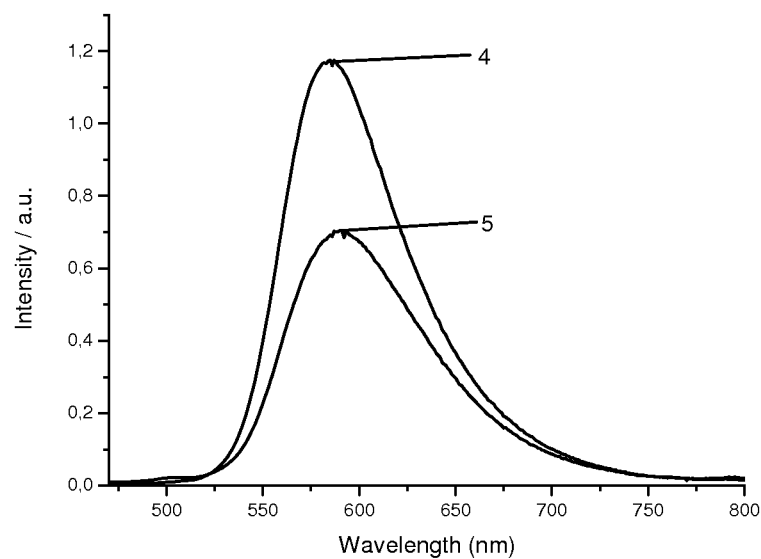
FIG. 3: Emission spectra of nitride phosphors prepared in different ways. The curve denoted by 4 shows an emission spectrum of a phosphor prepared in accordance with Comparative Example 2A), which was prepared by stoichiometric preparation with a single calcination step. The curve denoted by 5 shows an emission spectrum of a phosphor prepared in accordance with Comparative Example 2B), which was prepared with an excess of barium nitride in one calcination step.
Figure 4:
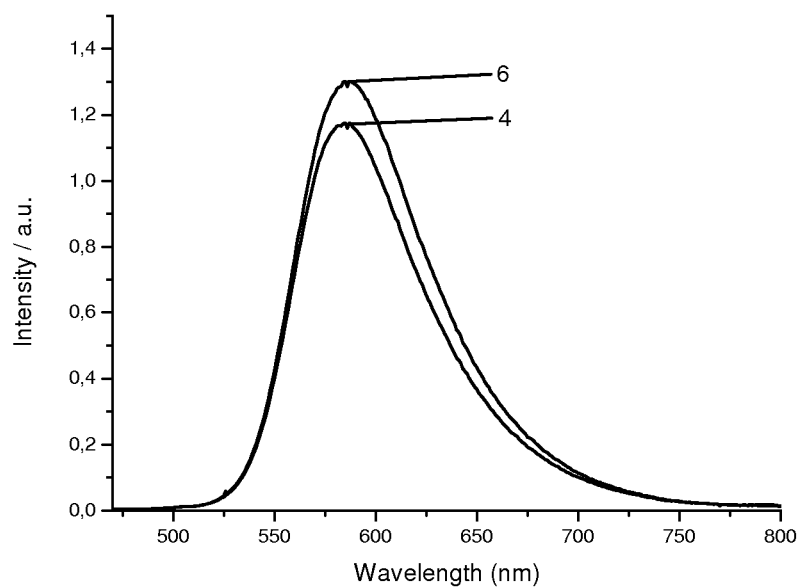
FIG. 4: Emission spectra of nitride phosphors prepared in different ways. The curve denoted by 4 shows an emission spectrum of a phosphor prepared in accordance with Comparative Example 2A), which was prepared using a stoichiometric mixture in a single calcination step. The curve denoted by 6 shows an emission spectrum of a phosphor prepared in accordance with Example 2C), which was prepared by stoichiometric mixing in a first calcination step with subsequent post-calcination of the phosphor with addition of 20% by weight of barium nitride.
Figure 5:
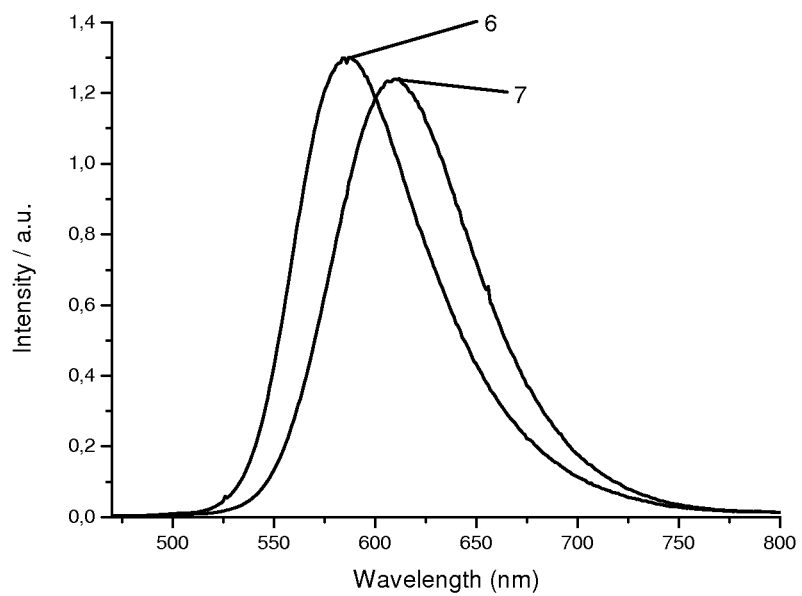
FIG. 5: Emission spectra of nitride phosphors prepared in different ways. The curve denoted by 6 shows an emission spectrum of a phosphor prepared in accordance with Example 2C), which was prepared by stoichiometric mixing in the first calcination step with subsequent post-calcination of the phosphor with addition of 20% by weight of barium nitride. The curve denoted by 7 shows an emission spectrum of a phosphor prepared in accordance with Example 2D), which was prepared by stoichiometric mixing in the first calcination step and subsequent post-calcination of the phosphor with addition of 20% by weight of strontium nitride.
Figure 6:
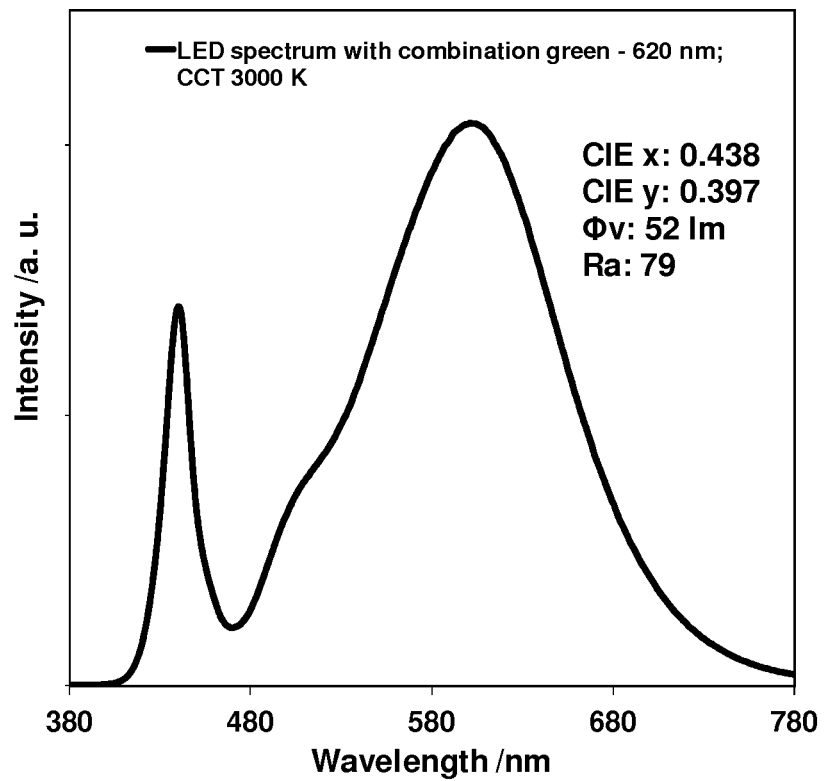
FIGS. 6 to 14: Emission spectra and results of the LEDs in accordance with Examples 13 to 21, where FIG. 6 relates to Example 13, FIG. 7 to Example 14, etc.
Figure 7:
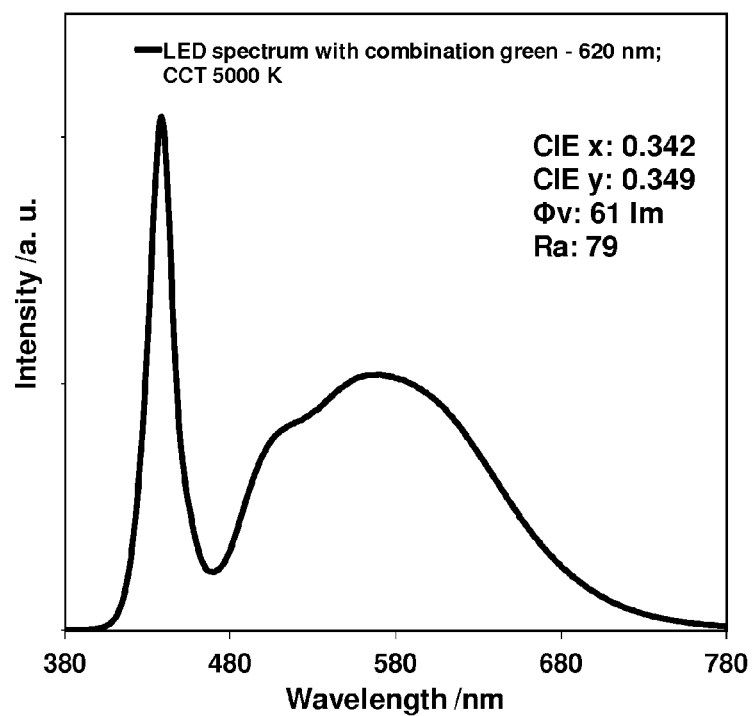
Figure 8:
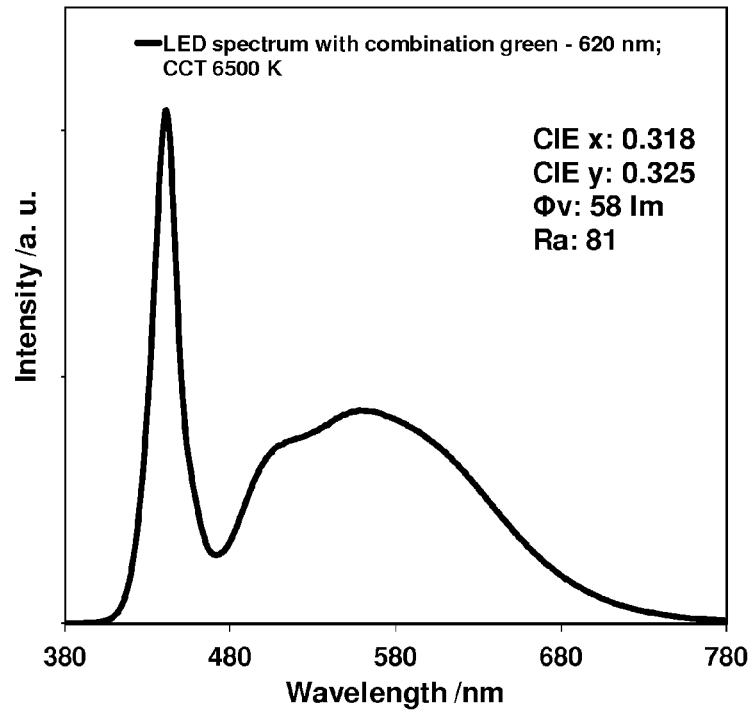
Figure 9:
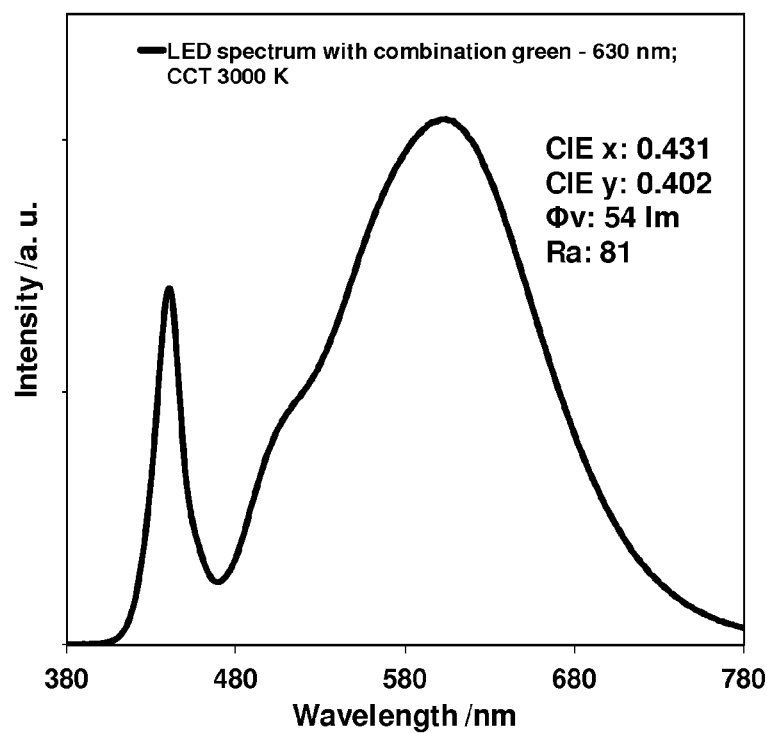
Figure 10:
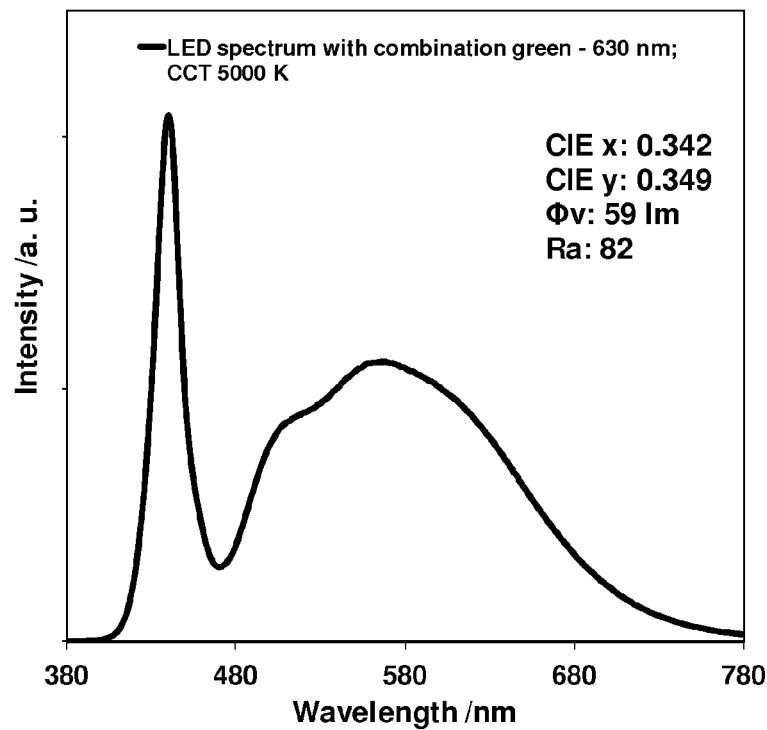
Figure 11:
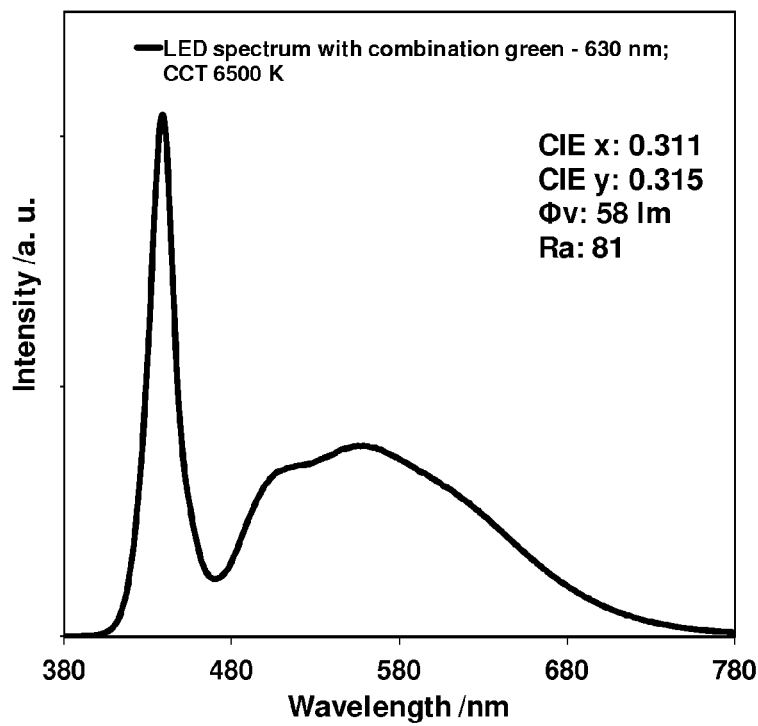
Figure 12:
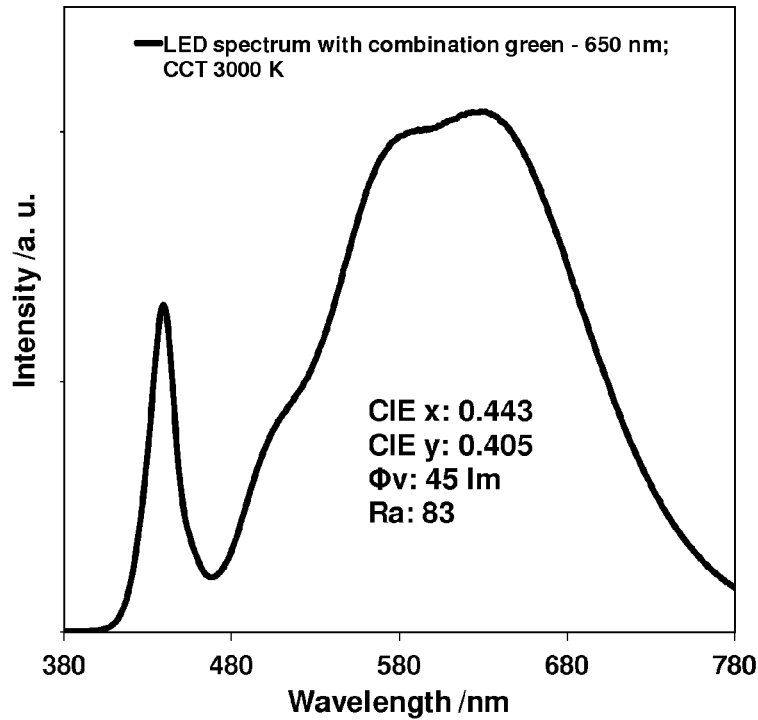
Figure 13:
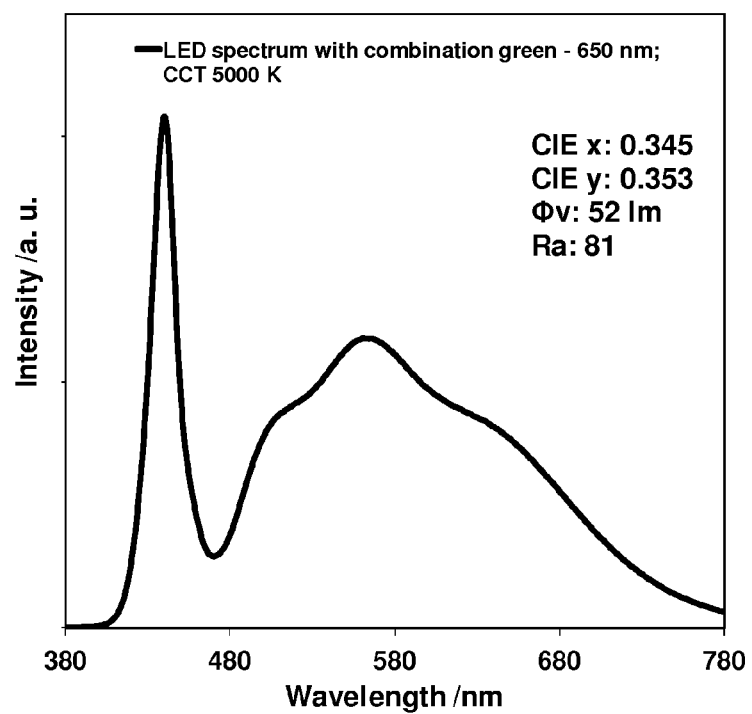
Figure 14:
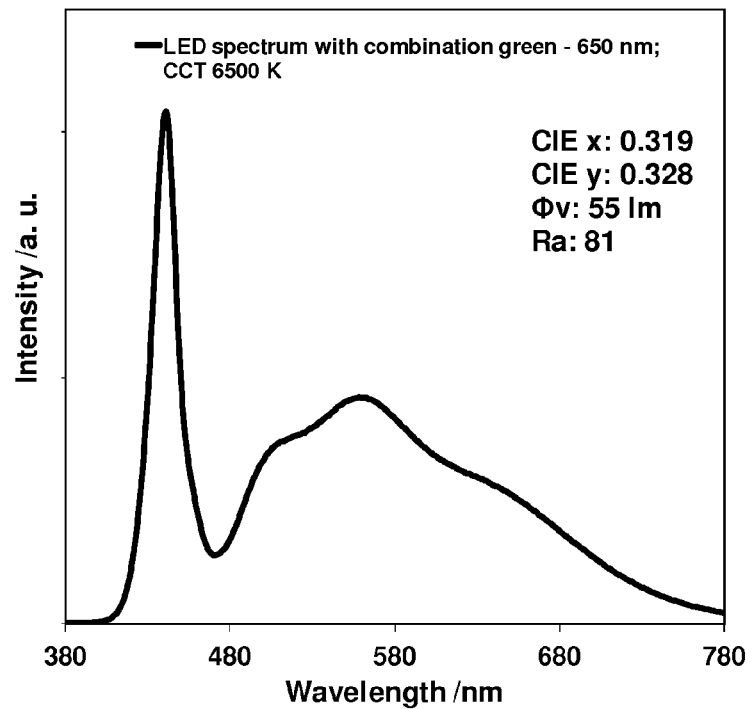

Results:

It can be seen from FIG. 1 that the phosphor prepared in accordance with Comparative Example 1A) has a higher emission intensity than the phosphor prepared in accordance with Comparative Example 1B). FIG. 2 shows that the phosphor according to the invention in accordance with Example 1C) has an even higher emission intensity than the phosphor prepared in accordance with Comparative Example 1A). This confirms how phosphors having increased emission efficiency can be prepared by the process according to the invention. The same applies in the case of the comparison of the intensities in FIGS. 3 and 4 of the phosphors prepared in Comparative Examples 2A) and 2B) and in Example 2C) according to the invention. In addition, comparison of the wavelengths in FIG. 5 of the phosphors prepared in Examples 2C) and 2D) shows that the emission wavelength can be shifted by the process according to the invention.

FIGS. 6 to 14 show that the phosphors according to the invention are very highly suitable for the production of white-emitting LEDs.

Figure 15:
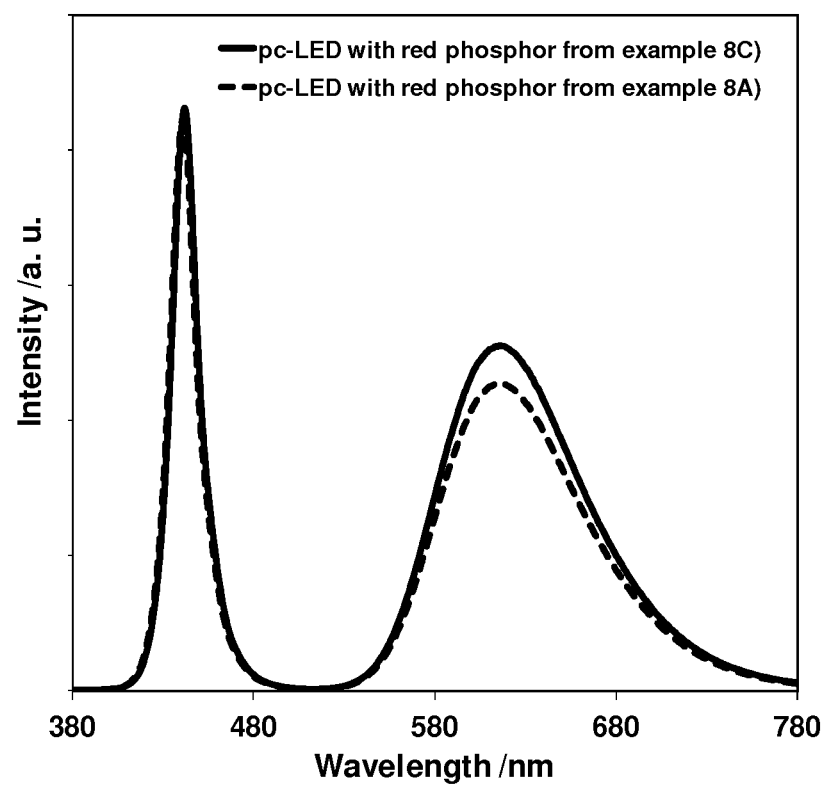
FIG. 15: Emission spectra and results of the LEDs in accordance with Example 22A) comprising the phosphor according to Example 8A) in accordance with the prior art and Example 22B) comprising the phosphor according to Example 8C) in accordance with the present invention.

It can be seen from FIG. 15 that the phosphor according to the invention prepared in accordance with Example 8C) has a higher proportion of the emission intensity in the LED spectrum than the phosphor prepared in accordance with Example 8A) on use in a pc-LED, in spite of an identical phosphor concentration.

The invention claimed is:

1. Process for increasing the radiation-induced emission efficiency and/or for shifting the emission wavelength of a europium-doped alkaline-earth metal siliconitride or of a europium-doped alkaline-earth metal silicooxynitride, comprising the steps:
   (a) preparation of a mixture of a europium-doped alkaline-earth metal siliconitride or a europium-doped alkaline-earth metal silicooxynitride and an alkaline-earth metal nitride, where the alkaline-earth metal of the europium-doped alkaline-earth metal siliconitride or of the europium-doped alkaline-earth metal silicooxynitride and of the alkaline-earth metal nitride may be identical or different; and
   (b) calcination of the mixture under non-oxidising conditions.

2. Process according to claim 1, in which the weight ratio of europium-doped alkaline-earth metal siliconitride or silicooxynitride to the alkaline-earth metal nitride in the mixture is in the range from 2:1 to 20:1.

3. Process according to claim 1, in which the alkaline-earth metal in the alkaline-earth metal nitride is different from the alkaline-earth metal in the alkaline-earth metal siliconitride or silicooxynitride.

4. Process according to claim 1, in which the europium-doped alkaline-earth metal siliconitride or silicooxynitride employed is prepared by a step (a'), where step (a') comprises the calcination of a mixture comprising a europium source, a silicon source and an alkaline-earth metal nitride under non-oxidising conditions and precedes step (a) of the process according to claim 1.

5. Process according to claim 1, in which the europium-doped alkaline-earth metal siliconitride or silicooxynitride is a compound of the general formula (I) or (II), $$EA_dEu_cE_eN_fO_x \cdot mSiO_2 \cdot nSi_3N_4 \quad (I)$$

in which the following applies to the symbols and indices used:
EA is at least one alkaline-earth metal;
E is Si;
$0.80 \leq d \leq 1.995$;
$0.005 \leq c \leq 0.2$;
$4.0 \leq e \leq 6.00$;
$5.00 \leq f \leq 8.70$;
$0 \leq x \leq 3.00$;
$0 \leq m \leq 2.50$;
$0 \leq n \leq 0.50$;
where the following relationship furthermore applies to the indices:

$$2d+2c+4e=3f+2x;$$

$$Ba_{1-a-b-c}Sr_aCa_bEu_cSi_7N_{10} \cdot mSiO_2 \cdot nSi_3N_4 \quad (II)$$

where the indices used have the following meanings:
$0 \leq a \leq 1$;
$0 \leq b \leq 1$;
$0.01 \leq c \leq 0.2$;
$0 \leq m \leq 2.50$;
$0 \leq n \leq 0.50$; and
$a+b+c \leq 1$.

6. Process according to claim 5 where the index "c" used for Formula II has the following meaning: $0.02 \leq c \leq 0.1$.

7. Process according to claim 1, in which the europium-doped alkaline-earth metal siliconitride or silicooxynitride is a compound of the formula (Ia) or (Ib),

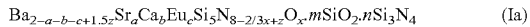

$$Ba_{2-a-b-c+1.5z}Sr_aCa_bEu_cSi_5N_{8-2/3x+z}O_x \cdot mSiO_2 \cdot nSi_3N_4 \quad (Ia)$$

where the indices used have the following meanings:
$0 \leq a \leq 2$;
$0 \leq b \leq 2$;
$0.01 \leq c \leq 0.2$;
$0 \leq x \leq 1$;
$0 \leq z \leq 3.0$;
$0 \leq m \leq 2.50$;
$0 \leq n \leq 0.50$;
and $a+b+c \leq 2+1.5z$;

$$Ba_{2-a-b-c-0.5x+1.5z}Sr_aCa_bEu_cSi_5N_{8-x+z}O_x \cdot mSiO_2 \cdot nSi_3N_4 \quad (Ib)$$

where the indices used have the following meanings:
$0 \leq a \leq 2$;
$0 \leq b \leq 2$;
$0.01 \leq c \leq 0.2$;
$0 \leq x \leq 1$;
$0 \leq z \leq 3.0$;
$0 \leq m \leq 2.50$;
$0 \leq n \leq 0.50$.

8. Process according to claim 7 where the indices c, x and z used for Formula Ia have the following meanings: $0.02 \leq c \leq 0.1$; $0 \leq x \leq 0.6$; and $0 \leq z \leq 1.0$ the indices c, x and z used for Formulae Ib have the following meanings: $0.02 \leq c \leq 0.1$; $0 \leq x \leq 0.6$; and $0 \leq z \leq 1.0$.

9. Process according to claim 8 where the index "z" used for Formulae Ia and Ib has the following meaning: z=0.

10. Process according to claim 1, in which the alkaline-earth metal nitride is selected from the group consisting of calcium nitride, strontium nitride, barium nitride and mixtures thereof.

11. Process according to claim 1, in which the calcination is carried out at a temperature in the range from 1200 to 2000° C.

12. Process according to claim 1, in which the non-oxidising conditions are produced by a reducing atmosphere.

13. Process according to claim 12, in which the reducing atmosphere comprises hydrogen.

14. Process for the preparation of a post-treated europium-doped alkaline-earth metal siliconitride or europium-doped alkaline-earth metal silicooxynitride comprising the following steps:
   (i) synthesis of a europium-doped alkaline-earth metal siliconitride or a europium-doped alkaline-earth metal silicooxynitride;
   (ii) calcination of a mixture comprising the europium-doped alkaline-earth metal siliconitride or europium-doped alkaline-earth metal silicooxynitride obtained in step (i) and an alkaline-earth metal nitride under non-oxidising conditions.

15. Process according to claim 14, characterised in that the synthesis of the europium-doped alkaline-earth metal siliconitride or of the europium-doped alkaline-earth metal silicooxynitride in step (i) is carried out by calcination of a mixture comprising a europium source, a silicon source and an alkaline-earth metal nitride under non-oxidising conditions.

16. Process according to claim 14, in which the weight ratio of the europium-doped alkaline-earth metal siliconitride or silicooxynitride obtained in step (i) to the alkaline-earth metal nitride in the mixture in step (ii) is in the range from 2:1 to 20:1.

17. Process according to claim 14, in which the post-treated europium-doped alkaline-earth metal siliconitride or silicooxynitride is a compound of the general formula (I) or (II), $$EA_d Eu_c E_e N_f O_x \cdot mSiO_2 \cdot nSi_3N_4 \quad (I)$$

in which the following applies to the symbols and indices used:
EA is at least one alkaline-earth metal;
E is Si;
$0.80 \leq d \leq 1.995$;
$0.005 \leq c \leq 0.2$;
$4.0 \leq e \leq 6.00$;
$5.00 \leq f \leq 8.70$;
$0 \leq x \leq 3.00$;
$0 \leq m \leq 2.50$;
$0 \leq n \leq 0.50$;
where the following relationship furthermore applies to the indices:

$$2d+2c+4e=3f+2x;$$

$$Ba_{1-a-b-c}Sr_aCa_bEu_cSi_7N_{10} \cdot mSiO_2 \cdot nSi_3N_4 \quad (II)$$

where the indices used have the following meanings:
$0 \leq a \leq 1$;
$0 \leq b \leq 1$;
$0.01 \leq c \leq 0.2$;
$0 \leq m \leq 2.50$;
$0 \leq n \leq 0.50$; and
$a+b+c \leq 1$.

18. Process according to claim 14, in which the post-treated europium-doped alkaline-earth metal siliconitride or silicooxynitride is a compound of the formula (Ia) or (Ib), $$Ba_{2-a-b-c+1.5z}Sr_aCa_bEu_cSi_5N_{8-2/3x+z}O_x \cdot mSiO_2 \cdot nSi_3N_4 \quad (Ia)$$

where the indices used have the following meanings:
$0 \leq a \leq 2$;
$0 \leq b \leq 2$;
$0.01 \leq c \leq 0.2$;
$0 \leq x \leq 1$;
$0 \leq z \leq 3.0$;
$0 \leq m \leq 2.50$;
$0 \leq n \leq 0.50$;
and $a+b+c \leq 2+1.5z$;

$$Ba_{2-a-b-c-0.5x+1.5z}Sr_aCa_bEu_cSi_5N_{8-x+z}O_x \cdot mSiO_2 \cdot nSi_3N_4 \quad (Ib)$$

where the indices used have the following meanings:
$0 \leq a \leq 2$;
$0 \leq b \leq 2$;
$0.01 \leq c \leq 0.2$;
$0 \leq x \leq 1$;
$0 \leq z \leq 3.0$;
$0 \leq m \leq 2.50$;
$0 \leq n \leq 0.50$.

19. Compound obtained by a process according to claim 5.

20. Compound of the formula (Ia), $$Ba_{2-a-b-c+1.5z}Sr_aCa_bEu_cSi_5N_{8-2/3x+z}O_x \cdot mSiO_2 \cdot nSi_3N_4 \quad \text{formula (Ia)}$$

where the indices used have the following meanings:
$0 \leq a \leq 2$;
$0 \leq b \leq 2$;
$0.01 \leq c \leq 0.2$;
$0 < x \leq 1$;
$0 \leq z \leq 3.0$;
$0 \leq m \leq 2.50$;
$0 \leq n \leq 0.50$;
and $a+b+c \leq 2+1.5z$.

21. Compound according to claim 20, where the indices used for formula Ia have the following meanings:
$0 \leq a \leq 2$;
$0 \leq b \leq 2$;
$0.02 \leq c \leq 0.1$;
$0.03 \leq x \leq 0.8$;
$0 \leq z \leq 1.0$;
$0 \leq m \leq 1.00$;
n=0;
and $a+b+c \leq 2+1.5z$.

22. Compound according to claim 21 where the indices x, z and m used for formula I1 have the following meanings: $0 \leq x \leq 0.6$; z=0 and m=0.

23. A method comprising converting LED emissions with a compound according to claim 19.

24. Light-emitting device comprising a compound according to claim 19.

* * * * *